(12) United States Patent
Ma et al.

(10) Patent No.: US 11,659,741 B2
(45) Date of Patent: May 23, 2023

(54) DISPLAY PANEL AND DISPLAY DEVICE

(71) Applicant: WUHAN TIANMA MICRO-ELECTRONICS CO., LTD., Wuhan (CN)

(72) Inventors: Yangzhao Ma, Wuhan (CN); Zhiqiang Xia, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 188 days.

(21) Appl. No.: 17/103,959

(22) Filed: Nov. 25, 2020

(65) Prior Publication Data
US 2022/0045155 A1 Feb. 10, 2022

(30) Foreign Application Priority Data
Aug. 7, 2020 (CN) .......................... 202010789153.4

(51) Int. Cl.
*H10K 59/131* (2023.01)
*H01L 27/32* (2006.01)
*H01L 27/12* (2006.01)

(52) U.S. Cl.
CPC ...... *H01L 27/3276* (2013.01); *H01L 27/3248* (2013.01); *H01L 27/3262* (2013.01); *H01L 27/1214* (2013.01)

(58) Field of Classification Search
CPC .......................................... H01L 27/32–3293
See application file for complete search history.

(56) References Cited

U.S. PATENT DOCUMENTS

| 10,756,136 B1 | 8/2020 | Ma et al. | |
| 2010/0148192 A1* | 6/2010 | Jung | H01L 51/5284 257/59 |
| 2015/0034913 A1* | 2/2015 | Yoon | H01L 51/5228 257/40 |
| 2015/0036300 A1* | 2/2015 | Park | H05K 1/14 156/212 |
| 2018/0219058 A1* | 8/2018 | Xiang | H01L 27/3225 |
| 2018/0261797 A1* | 9/2018 | Lee | H01L 27/3218 |
| 2019/0130822 A1* | 5/2019 | Jung | G09G 3/2003 |

(Continued)

FOREIGN PATENT DOCUMENTS

| CN | 109686859 A | 4/2019 |
| CN | 110061014 A | 7/2019 |

(Continued)

OTHER PUBLICATIONS

Office Action of CN Patent Application No. 202010789153.4.

*Primary Examiner* — Bryan R Junge
(74) *Attorney, Agent, or Firm* — Kilpatrick Townsend & Stockton, LLP

(57) ABSTRACT

A display panel and a display device are provided. A display area of the display panel includes an optical component area and a regular display area, and the optical component area and the regular display area both include light-emitting devices, so that the area of the display area becomes larger to meet the trend of full screen display. In the optical component area, a transparent conductive layer includes paired first and second etching slots, a connection wire arranged between the paired first and second etching slots, and an auxiliary layer arranged outside the paired first and second etching slots.

20 Claims, 21 Drawing Sheets

(56) References Cited

U.S. PATENT DOCUMENTS

| | | | |
|---|---|---|---|
| 2019/0393286 A1* | 12/2019 | Ding | .................... H01L 27/3246 |
| 2020/0194532 A1* | 6/2020 | Lee | ...................... G09G 3/3266 |
| 2021/0327967 A1 | 10/2021 | Zhang et al. | |
| 2021/0376047 A1 | 12/2021 | Xue et al. | |
| 2021/0408191 A1* | 12/2021 | Zhao | ................... H01L 27/3248 |
| 2021/0408200 A1* | 12/2021 | Zhao | ................... H01L 27/3227 |

FOREIGN PATENT DOCUMENTS

| | | |
|---|---|---|
| CN | 209071333 U | 7/2019 |
| CN | 110148621 A | 8/2019 |
| CN | 110265455 A | 9/2019 |
| CN | 110289304 A | 9/2019 |
| CN | 110634930 A | 12/2019 |
| CN | 110767701 A | 2/2020 |
| CN | 210052743 U | 2/2020 |

* cited by examiner

DISPLAY PANEL AND DISPLAY DEVICE

CROSS-REFERENCE TO RELATED APPLICATIONS

This application claims priority to Chinese patent application No. 202010789153.4, titled "DISPLAY PANEL AND DISPLAY DEVICE", filed Aug. 7, 2020, with the China National Intellectual Property Administration, which is incorporated herein by reference in its entirety.

FIELD

The present disclosure relates to the field of display, and in particular to a display panel and a display device.

BACKGROUND

With the rapid development of display technology, various screen technologies provides unlimited possibilities for electronic terminals. In particular, the organic light-emitting diode (OLED) as the representative of the display technology has been rapidly applied, and the features of various mobile terminals such as "full screen", "special-shaped screen", "sound under the screen" and "fingerprint under the screen" have been rapidly promoted. Many products with the feature of the "full screen" are launched by the major mobile phone and panel manufacturers, but an approximate full screen design such as "notch screen", "water drop screen" is still adopted in the most products. Since front cameras are provided on the mobile terminals, it is required to reserve a certain area for the front cameras. That is, in related technology, a proportion of a display area in a display panel is relatively low. In order to solve the problem of relatively low proportion of the display area, technology has developed that the display interface is completely covered by a display screen, that is, a light-sensitive component is arranged under the display screen. Although the display panel according to the related technology that the light-sensitive component is arranged under the display screen can increase the proportion of the display screen, imaging effects thereof is poor.

SUMMARY

In view of this, a display panel and a display device are provided according to the present disclosure, which can effectively solve the problem in the related technology, improve uniformity of light transmission of a light-transmissive area in an optical component area, and improving image acquisition effects of corresponding optical components in the optical component area.

To achieve the above objectives, the following solutions are provided according to the present disclosure.

A display panel includes multiple pixels, a display area and at least one transparent conductive layer.

The multiple pixels includes a first pixel and a second pixel. The first pixel includes a first light-emitting device and a first pixel circuit connected with each other, and the second pixel includes a second light-emitting device and a second pixel circuit connected with each other.

The display area includes an optical component area and a regular display area. The first light-emitting device is arranged in the optical component area, and the second light-emitting device is arranged in the regular display area.

A density of light-emitting devices in the optical component area is less than a density of light-emitting devices in the regular display area.

The at least one transparent conductive layer is arranged in the optical component area. The transparent conductive layer includes a first etching slot and a second etching slot that are paired with each other, a connection wire arranged between the first etching slot and the second etching slot that are paired with each other, and an auxiliary layer arranged outside the first etching slot and the second etching slot that are paired with each other.

Accordingly, based on the same inventive concept, a display device is further provided according to the present disclosure. The display device includes the above display panel.

Compared with the related technology, the solutions according to the present disclosure have at least the following advantages.

In the display panel and the display device according to the present disclosure, the display area of the display panel includes the optical component area and the regular display area, and both the optical component area and the regular display area include light-emitting devices, so that the area of the display area becomes larger to meet the trend of full screen display. Moreover, in the optical component area, the transparent conductive layer includes the first etching slot and the second etching slot that are paired with each other, the connection wire arranged between the first etching slot and the second etching slot that are paired with each other, and the auxiliary layer arranged outside the first etching slot and the second etching slot that are paired with each other. Not only signals can be transmitted by the connection wire, but also the integrity of the transparent conductive layer in the optical component area can be ensured by etching the transparent conductive layer to form slots and reserving the auxiliary layer, so that the uniformity of light transmission of the transparent conductive layer in the optical component area becomes higher, which improves uniformity of light transmission of the light-transmissive area in the optical component area and improving image acquisition effects of corresponding optical components in the optical component area.

BRIEF DESCRIPTION OF THE DRAWINGS

The drawings to be used in the description of the embodiments of the present disclosure will be described briefly as follows, in order to describe the embodiments of the present disclosure clearly. It is apparent that the drawings in the following description only illustrate some embodiments of the present disclosure.

DETAILED DESCRIPTION

Hereinafter, the embodiments of the present disclosure are explained clearly and completely in conjunction with the drawings in the embodiments of the disclosure. It is apparent that the embodiments in the following description are only some embodiments of the present disclosure, rather than all of the embodiments.

As described in the background section, in the related technology, a proportion of a display area in a display panel is relatively low. In order to solve the problem of relatively low proportion of the display area, technology has developed that the display interface is completely covered by a display screen, that is, a light-sensitive component is arranged under the display screen. Although the display panel according to the related technology that the light-sensitive component is arranged under the display screen can increase the proportion of the display screen, imaging effects thereof is poor.

In view of this, a display panel and a display device are provided according to the embodiments of the present disclosure, which can effectively solve the problem in the related technology, improve uniformity of light transmission of a light-transmissive area in an optical component area, and improving image acquisition effects of corresponding optical components in the optical component area.

The embodiments of the present disclosure are explained clearly in conjunction with FIGS. 1 to 22.

Figure 1:
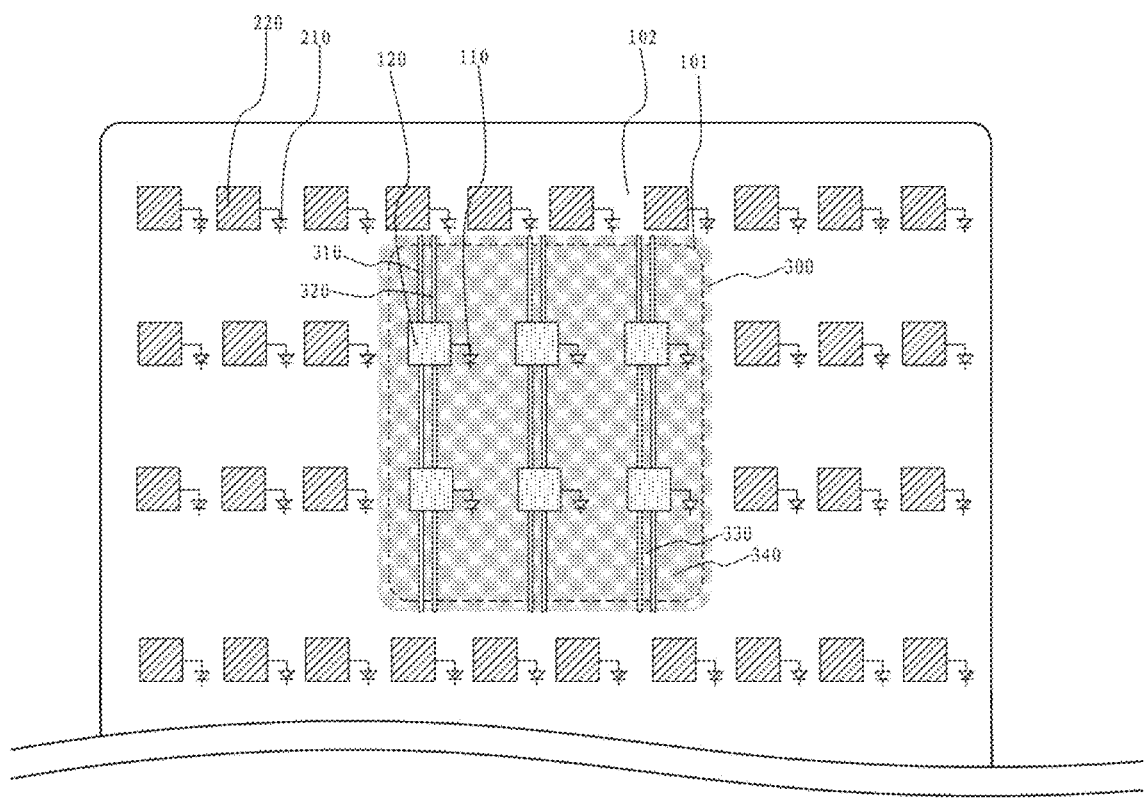
FIG. 1 is a schematic structural diagram of a display panel according to an embodiment of the present disclosure.

Reference is made to FIG. 1, which a schematic structural diagram of a display panel according to an embodiment of the present disclosure. The display panel includes multiple pixels, a display area and at least one transparent conductive layer.

The multiple pixels includes a first pixel and a second pixel. The first pixel includes a first light-emitting device 110 and a first pixel circuit 120 connected with each other, and the second pixel includes a second light-emitting device 210 and a second pixel circuit 220 connected with each other.

The display area includes an optical component area 101 and a regular display area 102. The first light-emitting device 110 is arranged in the optical component area 101, and the second light-emitting device 210 is arranged in the regular display area 102. In an embodiment, a density of light-emitting devices in the optical component area 101 is less than a density of light-emitting devices in the regular display area 102.

The at least one transparent conductive layer is arranged in the optical component area 101. The transparent conductive layer 300 includes a first etching slot 310 and a second etching slot 320 that are paired with each other, a connection wire 330 arranged between the first etching slot 310 and the second etching slot 320 that are paired with each other, and an auxiliary layer 340 arranged outside the first etching slot 310 and the second etching slot 320 that are paired with each other.

In an embodiment, the multiple pixels may include multiple first pixels and accordingly the number of the first light-emitting device 110 may be more than one, that is, there are multiple first light-emitting devices 110 in the display panel. In an embodiment, at least one of the multiple first light-emitting devices 110 may include multiple light-emitting sub-devices, and anodes of the multiple light-emitting sub-devices may be connected with each other.

As shown in FIG. 1, the transparent conductive layer 300 corresponds to the optical component area 101 according to the embodiment of the present disclosure. The transparent conductive layer 300 is etched to form the first etching slot 310 and the second etching slot 320 that are paired with each other, to obtaining the connection wire 330 arranged between the first etching slot 310 and the second etching slot 320 that are paired with each other. After the transparent conductive layer 300 corresponding to the optical component area 101 is etched, a portion outside the whole structure consisting of the paired first etching slot 310 and second etching slot 320 and the connection wire 330 forms the transparent auxiliary layer 340.

In an embodiment of the present disclosure, the transparent conductive layer 300 may be etched multiple times in the optical component area 101 to form multiple connection wires, to meet the requirement of transmission of more signals. That is, the transparent conductive layer according to the embodiment of the present disclosure includes multiple first etching slots 310 and multiple second etching slots 320, connection wires 330 arranged between the paired first etching slots 310 and second etching slots 320, and the auxiliary layer 340 arranged outside the paired first etching slots 310 and second etching slots 320 (that is, the transparent conductive layer includes the auxiliary layer in addition to the first etching slot, the second etching slot and the connection wire, where the auxiliary layer and the connection wire may formed in a same layer, with a same material and by a same process). In a case that the transparent conductive layer according to the embodiment of the present disclosure includes multiple connection wires, etching slots between two adjacent connection wires may be two independent etching slots, or an etching slot between two adjacent connection wires may alternatively be multiplexed (that is, the etching slot is not only used as an etching slot for one of the two adjacent connection wires, but also as an etching slot for the other connection wire in the two adjacent connection wires), which is not limited in the present disclosure.

It should be understood that the display area of the display panel includes the optical component area and the regular display area according to the embodiment of the present disclosure, and both the optical component area and the regular display area include light-emitting devices, so that the area of the display area becomes larger to meet the trend of full screen display. Moreover, in the optical component area, the transparent conductive layer includes the first etching slot and the second etching slot that are paired with each other, the connection wire arranged between the first etching slot and the second etching slot that are paired with each other, and the auxiliary layer arranged outside the first etching slot and the second etching slot that are paired with each other. Not only signals can be transmitted by the connection wire, but also the integrity of the transparent conductive layer in the optical component area can be ensured by etching the transparent conductive layer to form slots and reserving the auxiliary layer, so that the uniformity of light transmission of the transparent conductive layer in the optical component area becomes higher, which improves uniformity of light transmission of the light-transmissive area in the optical component area and improving image acquisition effects of corresponding optical components in the optical component area.

Figure 2:
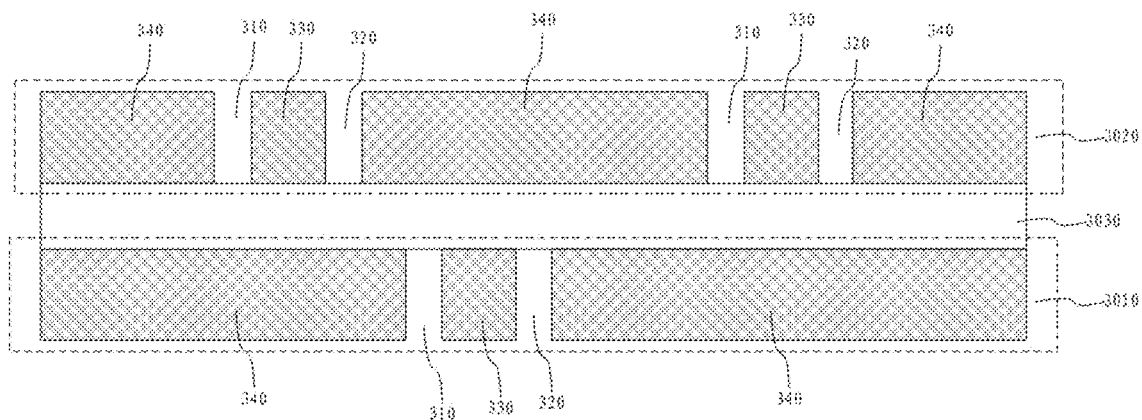
FIG. 2 is another schematic structural diagram of a display panel according to an embodiment of the present disclosure.

In one embodiment, in a case that the display panel according to the embodiment of the present disclosure includes multiple transparent conductive layers, in a direction perpendicular to a plane on which the display panel is located, the first etching slot and/or the second etching slot of at least one of the transparent conductive layers is overlapped with the auxiliary layer of at least one of the other transparent conductive layers. That is, in a case that the display panel according to the embodiment of the present disclosure includes multiple transparent conductive layers, an insulation isolation layer is arranged between two adjacent transparent conductive layers. In the direction perpendicular to the plane on which the display panel is located (that is, an overlapping direction of the multiple transparent conductive layers), the first etching slot of at least one of the transparent conductive layers is overlapped with the auxiliary layer of at least one of the other transparent conductive layers, or the second etching slot of at least one of the transparent conductive layers is overlapped with the auxiliary layer of at least one of the other transparent conductive layers, or both the first etching slot and the second etching slot of at least one of the transparent conductive layers are overlapped with the auxiliary layer of at least one of the transparent conductive layers. Reference is made to FIG. 2, which is a schematic structural diagram of a display panel according to an embodiment of the present disclosure. In FIG. 2, the display panel includes a first transparent conductive layer 3010 and a second transparent conductive layer 3020, for example. An insulation isolation layer 3030 is arranged between the first transparent conductive layer 3010 and the second transparent conductive layer 3020. Both the first transparent conductive layer 3010 and the second transparent conductive layer 3020 include a first etching slot 310 and a second etching slot 320 that are paired with each other, and a connection wire 330 is arranged between the first etching slot 310 and the second etching slot 320 that are paired with each other. The first etching slot 310 and the second etching slot 320 of the first transparent conductive layer 3010 are overlapped with the auxiliary layer 340 of the second transparent conductive layer 3020, and the first etching slot 310 and the second etching slot 320 of the second transparent conductive layer 3020 are overlapped with the auxiliary layer 340 of the first transparent conductive layer 3010.

It should be understood that the etching slots in each of the transparent conductive layers are overlapped or covered by auxiliary layers of other transparent conductive layers, which can ensure that the thicknesses of transparent conductive layers corresponding to the etching slots of each of the transparent conductive layers in the direction perpendicular to the plane on which the display panel is located are basically the same, and avoid the case that a thickness difference between transparent conductive layers corresponding to different etching slots is so large as to affect the uniformity of light transmission.

Figure 3:
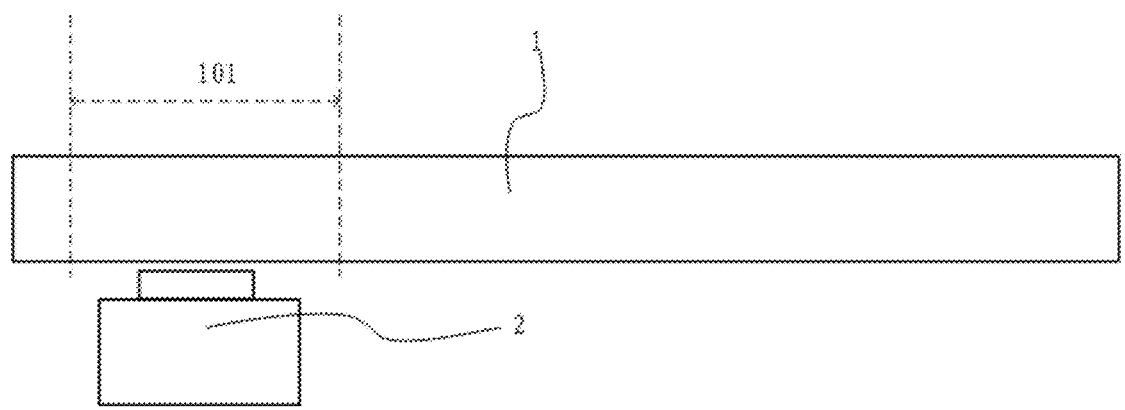
FIG. 3 is a schematic structural diagram of a display device according to an embodiment of the present disclosure.

It should be noted that the optical component area according to the embodiment of the present disclosure may be provided with optical components such as a camera, which is not limited in the present disclosure and can be designed according to practical application A schematic structural diagram of the display device is shown in FIG. 3, where the display device includes a display panel 1 and an optical component 2. The display panel 1 includes an optical component area 101, and the optical component 2 is arranged on a non-light-output side of the display panel 1 and correspondingly arranged at the optical component area 101. In one embodiment, the optical component 2 may be a camera.

Figure 4:
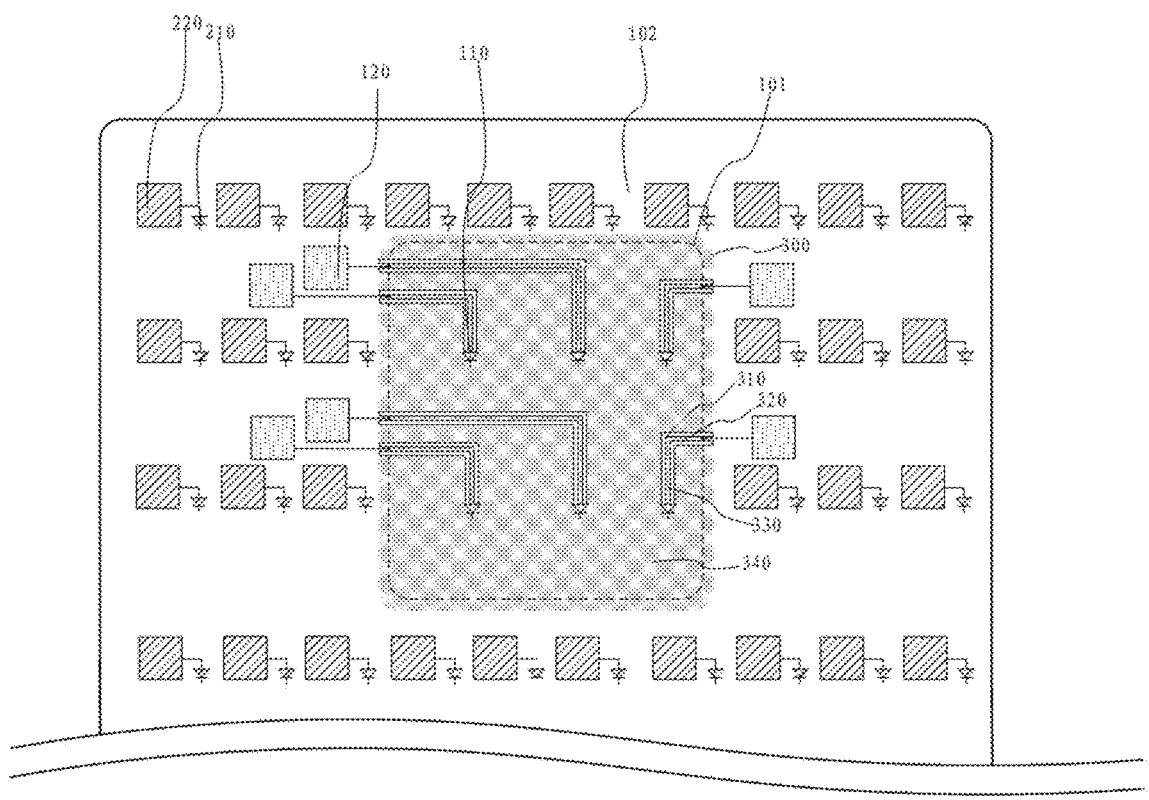
FIG. 4 is another schematic structural diagram of a display panel according to an embodiment of the present disclosure.

As shown in FIG. 1, both the first light-emitting device 110 and the first pixel circuit 120 according to the embodiment of the present disclosure may be arranged in the optical component area 101, and the second light-emitting device 210 and the second pixel circuit 220 according to the embodiment of the present disclosure are arranged in the regular display area 102. Alternatively, the first light-emitting device according to the embodiment of the present disclosure may be arranged in the optical component area, and the first pixel circuit connected with the first light-emitting device may be arranged outside the regular display area, for example, the first pixel circuit is arranged in the regular display area. Similarly the second light-emitting device and the second pixel circuit are arranged in the regular display area. As shown in FIG. 4, which is a schematic structural diagram of a display panel according to an embodiment of the present disclosure, the display panel includes a display area, and the display area includes an optical component area 101 and a regular display area 102. The first light-emitting device 110 is arranged in the optical component area 101, and the first pixel circuit 120 connected with the first light-emitting device 110 is arranged outside the optical component area 101, which can further improve a light transmission area of the optical component area, and ensure that the image acquisition effects of the optical components arranged in the optical component area of the display panel is high. In one embodiment, the first pixel circuit connected with the first light-emitting device may be arranged between the regular display area and the optical component area, or the first pixel circuit connected with the first light-emitting device may be arranged in the regular display area, which is not limited in the present disclosure. In one embodiment, the optical component area 101 includes multiple first light-emitting devices 110.

Figure 5:
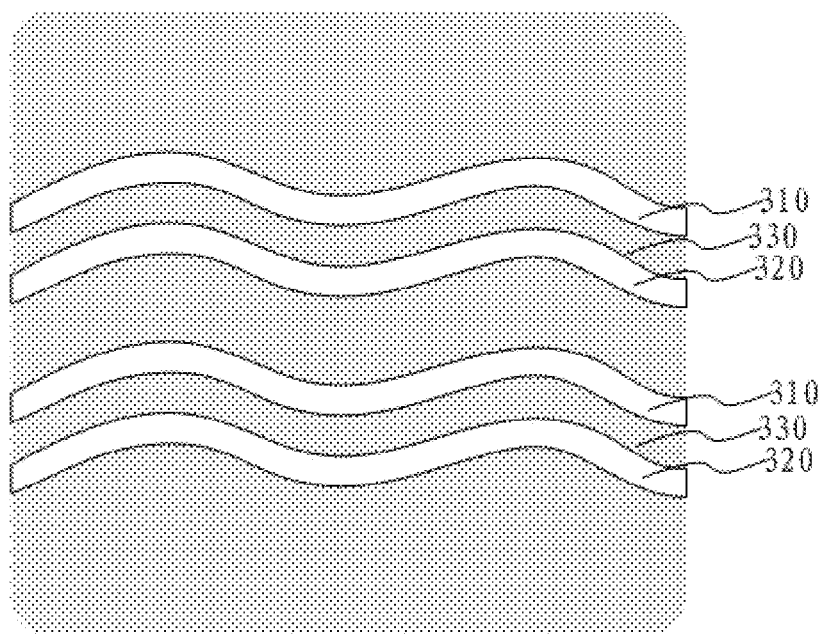
FIG. 5 is a schematic structural diagram of an etching slot according to an embodiment of the present disclosure.

Reference is made to FIG. 5, which shows a schematic structural diagram of an etching slot according to an embodiment of the present disclosure. In the transparent conductive layer according to the embodiment of the present disclosure, at least one side edge of at least one of the first etching slot 310 and the second etching slot 320 is a wavy line.

It should be understood that at least one side edge of at least one of the first etching slot 310 and the second etching slot 320 is a wavy line according to the embodiment of the present disclosure, which can further improve the diffraction of the etching slot. In the first etching slot according to the embodiment of the present disclosure, one side edge or two side edges arranged in a direction perpendicular to an extension direction of the first etching slot are wavy lines. Alternatively, in the second etching slot according to the embodiment of the present disclosure, one side edge or two side edges arranged in a direction perpendicular to an extension direction of the second etching slot are wavy lines. Alternatively, in the first etching slot according to the embodiment of the present disclosure, one side edge or two side edges arranged in the direction perpendicular to the extension direction of the first etching slot are wavy lines, and in the second etching slot according to the embodiment of the present disclosure, one side edge or two side edges arranged in the direction perpendicular to the extension direction of the second etching slot are wavy lines. In one embodiment, at the first etching slot, the second etching slot and the connection wire arranged between the first etching slot and the second etching slot according to the embodiment of the present disclosure, side edges of the first etching slot and the second etching slot, which face the connection wire arranged between the first etching slot and the second etching slot, are formed to be wavy lines, which can not only improve the diffraction of the etching slot at the edge of an independent connection wire, but also improve the diffraction of the etching slot between adjacent connection wires.

In an embodiment of the present disclosure, the wavy line according to the present disclosure may be cosine-shaped or sine-shaped, which is not limited in the present disclosure. A width of the etching slot and a width of the connection wire may be optimized to further improve the diffraction of the etching slot according to the embodiment of the present disclosure. The first etching slot and/or the second etching slot according to the embodiment of the present disclosure has a width ranging from 2 μm to 5 μm, inclusive, and the connection wire according to the embodiment of the present disclosure has a width ranging from 2 μm to 5 μm, inclusive.

Figure 6:
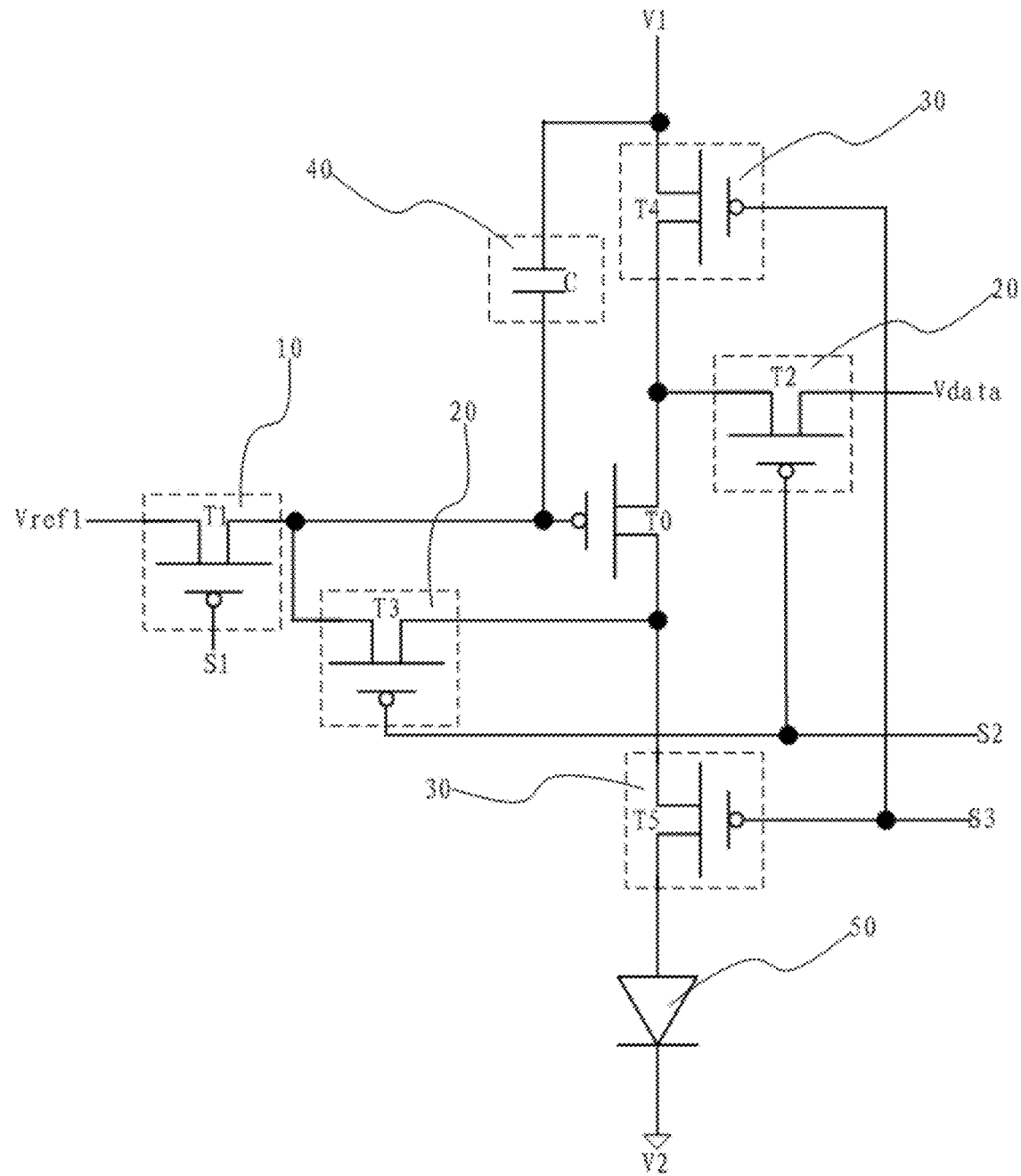
FIG. 6 is a schematic structural diagram of a pixel drive circuit according to an embodiment of the present disclosure.

The pixel drive circuit according to the embodiment of the present disclosure is electrically connected with the light-emitting device (that is, the first pixel drive circuit is electrically connected with the first light-emitting device, and the second pixel drive circuit is electrically connected with the second light-emitting device), where the pixel drive circuit may include multiple transistors and capacitors. All the transistors and capacitors cooperate with each other to provide a drive current for the light-emitting device, and the light-emitting device emits light in response to the drive current. Circuit compositions of the first pixel drive circuit and the second pixel drive circuit may be the same according to an embodiment of the present disclosure. Reference is made to FIG. 6, which is a schematic structural diagram of a pixel drive circuit according to an embodiment of the present disclosure. The pixel drive circuit includes a drive transistor T0, a reset device 10 electrically connected with the drive transistor T0, a data writing device 20, a light emitting control device 30 and a storage device 40. The reset device 10 is configured to transmit a first reference voltage Vref1 to a gate of the drive transistor T0, to reset a gate voltage of the drive transistor T0. The data writing device 20 is configured to write a data voltage Vdata into a first terminal of the drive transistor T0. The light emitting control device 30 is configured to transmit a drive current generated by the drive transistor T0 to a light-emitting device 50, so that the light-emitting device 50 emits light in response to the drive current. The storage device 40 is configured to maintain a voltage at the gate of the drive transistor T0. In one embodiment, the display panel according to the embodiment of the present disclosure is an organic light-emitting display panel. In one embodiment, the transistors according to the embodiment of the present disclosure are all thin film transistors.

As shown in FIG. 6, the reset device 10 according to an embodiment of the present disclosure includes a reset transistor T1, where a first terminal of the reset transistor T1 is connected with the first reference voltage Vref1, a gate of the reset transistor T1 is electrically connected with a first reset signal S1, and a second terminal of the reset transistor T1 is electrically connected with the gate of the drive transistor T0. The data writing device 20 includes a first data writing transistor T2 and a second data writing transistor T3. A gate of the first data writing transistor T2 and a gate of the second data writing transistor T3 are both electrically connected with a first scan signal S2. A first terminal of the first data writing transistor T2 is connected with the data voltage Vdata, and the second terminal of the first data writing transistor T2 is electrically connected with the first terminal of the drive transistor T0. A first terminal of the second data writing transistor T3 is electrically connected with the gate of the drive transistor T0, and a second terminal of the second data writing transistor T3 is electrically connected with a second terminal of the drive transistor T0. The light emitting control device 30 includes a first light emitting control transistor T4 and a second light emitting control transistor T5. A gate of the first light emitting control transistor T4 and a gate of the second light emitting control transistor T5 are both electrically connected with a second scan signal S3. A first terminal of the first light emitting control transistor T4 is connected with a first voltage, and a second terminal of the first light emitting control transistor T4 is electrically connected with the first terminal of the drive transistor T0. A first terminal of the second light emitting control transistor T5 is electrically connected with the second terminal of the drive transistor T0, and a second terminal of the second light emitting control transistor T5 is electrically connected with a first terminal of the light-emitting device 50. A second terminal of the light-emitting device 50 is connected with a second voltage V2. The storage device 40 includes a storage capacitor C, a first plate of the storage capacitor C is connected with the first voltage V1, and a second plate of the storage capacitor C is electrically connected with the gate of the drive transistor T0.

Figure 7:
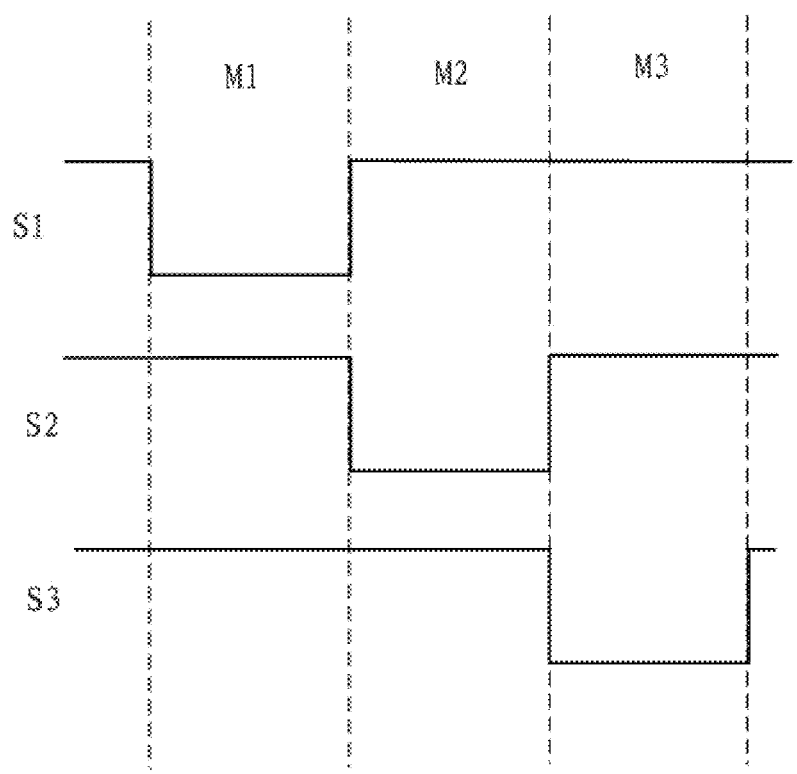
FIG. 7 is a sequence diagram according to an embodiment of the present disclosure.

Combined reference is made to FIGS. 6 and 7, where FIG. 7 is a sequence diagram according to an embodiment of the present disclosure. In an embodiment of the present disclosure, description is made by taking a case in which all transistors in the pixel circuit are P-type transistors for example (that is, in a case that a control signal at a gate of a transistor is at a low level, the transistor is turned on, and in a case that the control signal at the gate of the transistor is at a high level, the transistor is turned off). An operating process of the pixel drive circuit according to the embodiment of the present disclosure includes a reset stage M1, a data writing stage M2 and a light-emitting stage M3 that are performed in sequence.

In the reset stage M1, the reset transistor T1 is turned on and transmits the first reference voltage Vref1 to the gate of the drive transistor T0, in which case the transistors of the data writing device 20 and the light emitting control device 30 are all turned off. The first reference voltage Vref1 is a voltage that can control the drive transistor T0 to turn on.

In the data writing stage M2, the transistors of the light emitting control device 30 and the reset transistor T1 are all turned off, and the first data writing transistor T2 and the second data writing transistor T3 are turned on. The first data writing transistor T2 outputs the data voltage Vdata to the first terminal of the drive transistor T0, while the second data writing transistor T3 connects the gate of the drive transistor T0 with the second terminal of the drive transistor T0.

In the light-emitting stage M3, the transistors of the data writing device 20 and the reset transistor T1 are all turned off, and the first light emitting control transistor T4 and the second light emitting control transistor T5 are turned on to form a path including the first voltage V1, the first light emitting control transistor T4, the drive transistor T0, the second light emitting control transistor T5, the light-emitting device 50 and the second voltage V2, by which the drive current generated by the drive transistor TO is transmitted to the light-emitting device 50, and the light-emitting device 50 emits light in response to the drive current.

Figure 8:
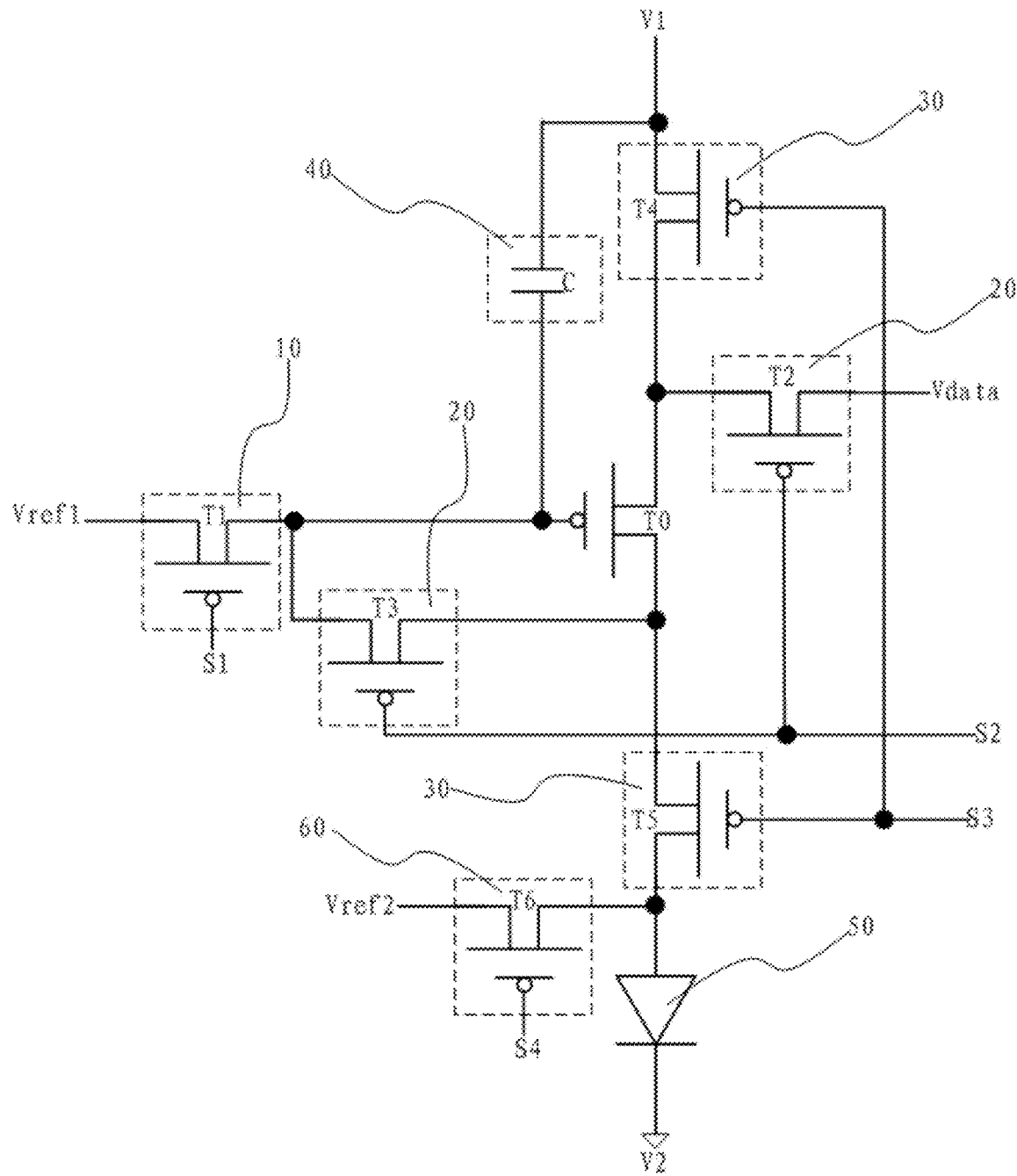
FIG. 8 is another schematic structural diagram of a pixel circuit according to an embodiment of the present disclosure.
Figure 9:
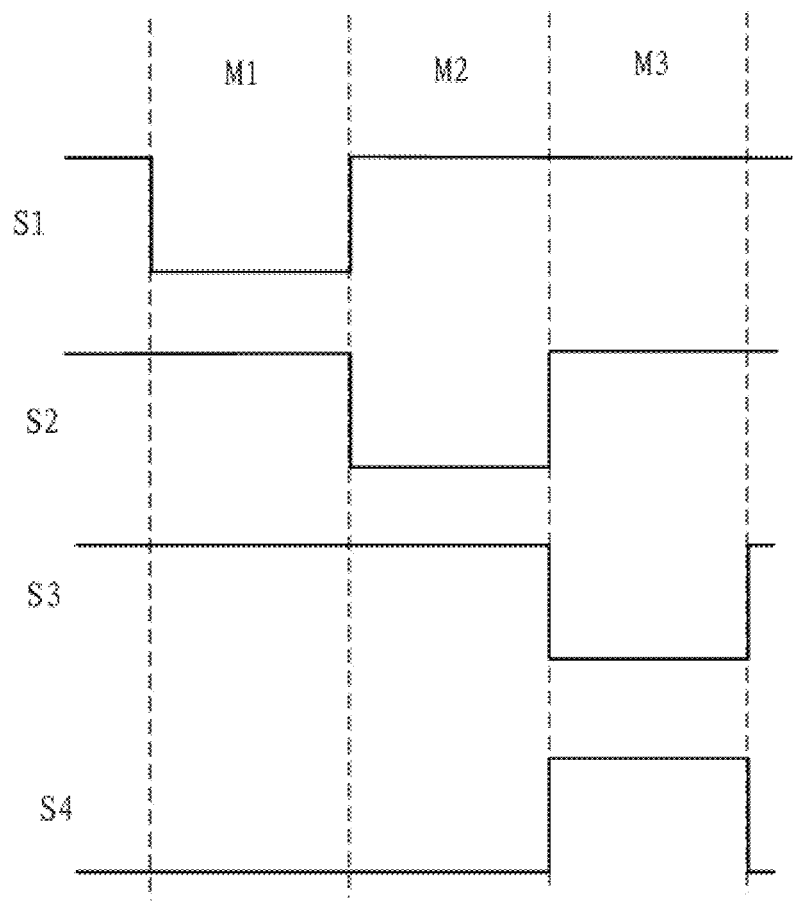
FIG. 9 is another sequence diagram according to an embodiment of the present disclosure.

In one embodiment, the pixel circuit according to an embodiment of the present disclosure may further include a black state holding device. Reference is made to FIG. 8, which is a schematic structural diagram of a pixel circuit according to an embodiment of the present disclosure. The pixel circuit further includes a black state holding device 60 electrically connected with the light-emitting device. The black state holding device 60 is configured to transmit a second reference voltage Vref2 to the light-emitting device 50, so that the light-emitting device 50 is controlled to turn off and kept in a blacked-out state outside the light-emitting stage. As shown in FIG. 8, the black state holding device 60 according to an embodiment of the present disclosure includes a black state holding transistor T6. A gate of the black state holding transistor T6 is electrically connected with a second reset signal S4. A first terminal of the black state holding transistor T6 is connected with the second reference signal Vref2, and a second terminal of the black state holding transistor T6 is electrically connected with the first terminal of the light-emitting device 50. The pixel circuit shown in FIG. 8 according to the embodiment of the present disclosure as shown in FIG. 8 includes the reset stage M1, the data writing stage M2 and the light-emitting stage M3 which are the same as in the pixel circuit shown in FIG. 6. Reference is made to FIG. 9, which is a sequence diagram according to an embodiment of the present disclosure. In the reset stage M1 and the data writing stage M2, the black state holding transistor T6 is controlled by the second reset signal S4 to turn on, to transmit the second reference signal Vref2 to the first terminal of the light-emitting device 50, to keep the light-emitting device 50 in the blacked-out state, and avoid the case that the light-emitting device is not dark in the blacked-out state in the reset stage and the data writing stage. In the light-emitting stage M3, the black state holding transistor T6 is controlled by the second reset signal S4 to turn off, which can ensure that the light-emitting device 50 emits light normally.

It should be noted that a circuit configuration of the pixel circuit is not limited in the embodiment of the present disclosure, and other circuit connection structures may be used in other embodiments of the present disclosure. The drive transistor, the reset transistor, the data writing transistor, the light emitting control transistor and the black state holding transistor according to the embodiment of the present disclosure may all be P-type thin film transistors; or the drive transistor, the reset transistor, the data writing transistor, the light emitting control transistor and the black state holding transistor may all be N-type thin film transistors. The first voltage according to the embodiment of the present disclosure is provided by an anode voltage terminal, the second voltage is provided by a cathode voltage terminal, and the light-emitting device may be a light-emitting diode, which is not limited in the present disclosure.

It should be understood that the pixel circuits shown in FIG. 6 and FIG. 8 according to the present disclosure are only two kinds of all pixel circuits applicable to the present disclosure. In other embodiments of the present disclosure, the pixel circuit may be other circuit structures with multiple connected devices such as transistors and capacitors. In order to provide scan signals (the scan signals include the first scan signal and the second scan signal shown in FIG. 6 and FIG. 8), reset signals (the reset signals include the first reset signal shown in FIG. 6 and FIG. 8, and the second reset signal shown in FIG. 8), data signals (for example, the data voltage shown in FIG. 6 and FIG. 8), reference voltages (for example, the first reference voltage and the second reference voltage shown in FIG. 6 and FIG. 8), and a power supply voltage (for example, the first voltage shown in FIG. 6 and FIG. 8) for the pixel circuit, the display panel accordingly includes a scan signal line, a reset signal line, a data line, a reference voltage line and a power supply voltage line outside the optical component area.

Figure 10:
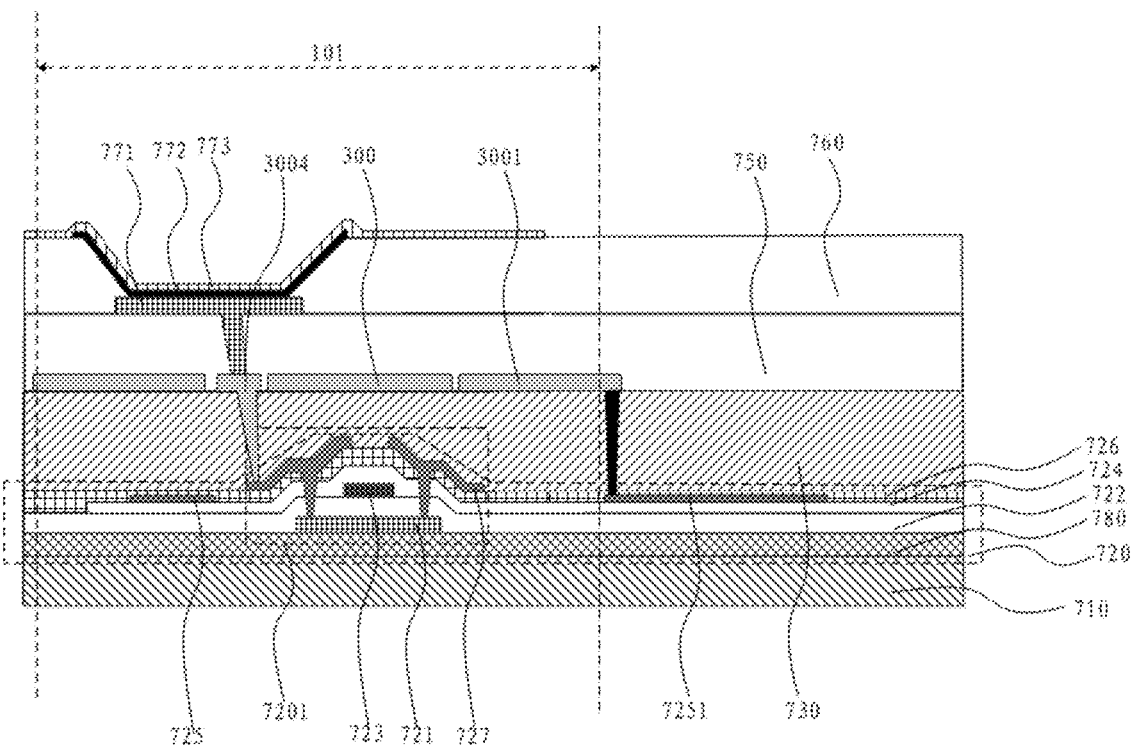
FIG. 10 is another schematic structural diagram of a display panel according to an embodiment of the present disclosure.

In the embodiment of the present disclosure, as the first pixel circuit is arranged in the optical component area (built-in TFT), to provide corresponding signals for the first pixel circuit through the scan signal line, the reset signal line, the data line, the reference voltage line and the power supply voltage line, a transition line may be arranged in the optical component area to electrically connect with wirings outside the optical component area according to an embodiment of the present disclosure. The transition line may be made from the transparent conductive layer. That is, the first pixel circuit according to the embodiment of the present disclosure is arranged in the optical component area, the connection wire includes at least one of a scan signal transition line, a data transition line, a reset signal transition line, a reference voltage transition line and a power supply voltage transition line that are connected with the first pixel circuit. The scan signal transition line is electrically connected with the scan signal line, the data transition line is electrically connected with the data line, the reset signal transition line is electrically connected with the reset signal line, the reference voltage transition line is electrically connected with the reference voltage line and the power supply voltage transition line is electrically connected with the power supply voltage line. Reference is made to FIG. 10, which is a schematic structural diagram of a display panel according to an embodiment of the present disclosure. The display panel according to the embodiment of the present disclosure includes a bearing substrate 710, a transistor array layer 720, a first insulation layer 722, a gate metal layer 723, a second insulation layer 724, a capacitor metal layer 725, a third insulation layer 726, a source-drain metal layer 727, a passivation layer 730, a transparent structure layer, a planarization layer 750 and a pixel definition layer 760.

The transistor array layer 720 is arranged on a surface of the bearing substrate 710, where the transistor array layer 720 includes a semiconductor layer 721 arranged on a surface of the bearing substrate 710. The first insulation layer 722 is arranged on a side of the semiconductor layer 721 which faces away from the bearing substrate 710. The gate metal layer 723 is arranged on a side of the first insulation layer 722 which faces away from the bearing substrate 710. The second insulation layer 724 is arranged on a side of the gate metal layer 723 which faces away from the bearing substrate 710. The capacitor metal layer 725 is arranged on a side of the second insulation layer 724 which faces away from the bearing substrate 710. The third insulation layer 726 is arranged on a side of the capacitor metal layer 725 which faces away from the bearing substrate 710. The source-drain metal layer 727 is arranged on a side of the third insulation layer 726 which faces away from the bearing substrate 710. An active region in the semiconductor layer 721 of the transistor array layer 720, a gate in the gate metal layer 723 and a source and a drain in the source-drain metal layer 727 form a transistor. The transistor array layer 720 includes the first pixel circuit and the second pixel circuit, where the first pixel circuit is arranged in the optical component area 101 and includes multiple transistors 7201.

The passivation layer 730 is arranged on a side of the transistor array layer 720 which faces away from the bearing substrate 710.

The transparent structure layer is arranged on a side of the passivation layer 730 which faces away from the bearing substrate 710. The transparent structure layer includes at least one transparent conductive layer 300, and in a case that the transparent structure layer includes multiple laminated transparent conductive layers, adjacent transparent conductive layers are isolated and insulated from each other by an isolation layer.

The planarization layer 750 is arranged on a side of the transparent structure layer which faces away from the bearing substrate 710.

The pixel definition layer 760 is arranged on a side of the planarization layer 750 which faces away from the bearing substrate 710. The pixel definition layer 760 includes multiple openings, and the light-emitting device is arranged at the opening of the pixel definition layer 760. The light-emitting device according to an embodiment of the present disclosure may include an anode 771, a light-emitting layer 772 and a cathode 773 that are laminated in order. Due to the existence of the transparent conductive layer 300, the anode 771 is electrically connected with the transistor 7201 of the first pixel circuit via via-holes in the following manner: a terminal 3004 connected with the anode 771 via a via-hole is arranged in the same layer with the transparent conductive layer 300, and the transistor 7201 of the first pixel circuit is electrically connected with the terminal 3004 via a via-hole, to connect the anode 771 with the transistor 7201 of the first pixel circuit, where the terminal may be a part of the transparent conductive layer. In one embodiment, the transparent conductive layer may be hollowed out and arranged isolated, at the via-hole, from the path connecting the anode and the transistor, to electrically connect the anode with the transistor. In one embodiment, under the same test conditions, a light transmittance of the transparent conductive layer 300 is higher than a light transmittance of the anode 771.

In one embodiment, the display panel according to an embodiment of the present disclosure further includes a buffer layer 780 arranged between the semiconductor layer 721 and the bearing substrate 710. The buffer layer 780 can prevent impurities and the like from entering the semiconductor layer 721 when the semiconductor layer is being fabricated.

As shown in FIG. 10, a connection wire is formed in the transparent conductive layer 300 according to the embodiment of the present disclosure, and the connection wire includes a transition line 3001. The transition line 3001 includes at least one of the scan signal transition line, the data transition line, the reset signal transition line, the reference voltage transition line and the power supply voltage transition line connected with the first pixel circuit. In a case that the display panel according to the embodiment of the present disclosure includes one transparent conductive layer, transition lines such as the scan signal transition line, the data transition line, the reset signal transition line, the reference voltage transition line and the power supply voltage transition line are all arranged in a same transparent conductive layer. In one embodiment, in a case that two connection wires are overlapped, one of the two connection wires may be bridged over, for example, a light-emitting region. In a case that the display panel according to the embodiment of the present disclosure includes multiple transparent conductive layers, transition lines such as the scan signal transition line, the data transition line, the reset signal transition line, the reference voltage transition line and the power supply voltage transition line may be respectively arranged in different transparent conductive layers according to practical applications. Alternatively, the above transition lines are divided into groups, so that some of the transition lines are arranged in a same transparent conductive layer, while the others are arranged in other transparent conductive layers, which is not limited in the present disclosure. A signal line is formed in the gate metal layer 723, the capacitor metal layer 725 and the source-drain metal layer 727 according to an embodiment of the present disclosure. The signal line includes at least one of the scan signal line, the reset signal line, the data line, the reference voltage line and the power supply voltage line. In a case that the transition line 3001 of the optical component area 101 according to the embodiment of the present disclosure is connected with a signal line outside the optical component area 101, for example, the transition line 3001 is connected with a signal line 7251 in the capacitor metal layer 725, the connection may be implemented via a via-hole outside the optical component area 101.

Figure 11:
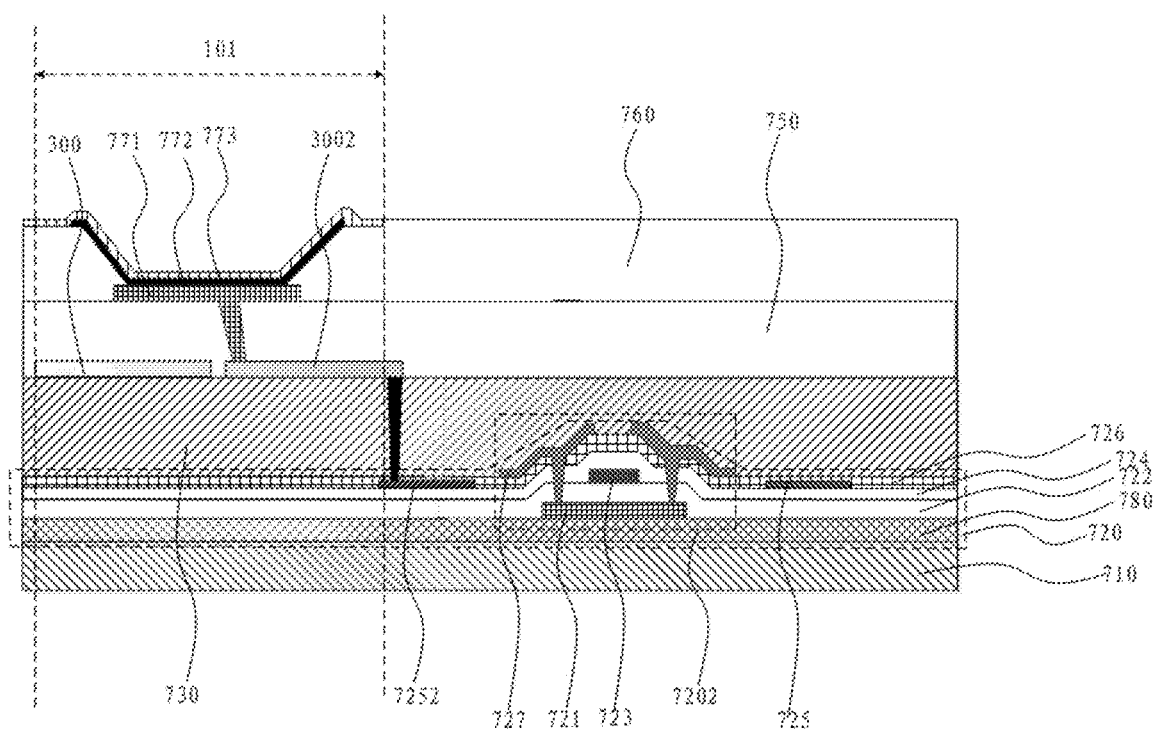
FIG. 11 is another schematic structural diagram of a display panel according to an embodiment of the present disclosure.

In the optical component area according to the embodiment of the present disclosure, in a case that the first pixel circuit is arranged outside the optical component area (external TFT), since the scan signal line, the reset signal line, the data line, the reference voltage line and the power supply voltage line are all arranged outside the optical component area, the first pixel circuit may be directly connected with these lines outside the optical component area. Since the first light-emitting device is arranged in the optical component area and is electrically connected with the first pixel circuit, an electrode transition line electrically connected with the first light-emitting device may be formed in the optical component area according to an embodiment of the present disclosure, so that the first light-emitting device can be electrically connected with the first pixel circuit via the electrode transition line. The electrode transition line may be formed by etching slots on the transparent conductive layer. That is, the first pixel circuit according to the embodiment of the present disclosure is arranged outside the optical component area, the connection wire includes the electrode transition line electrically connected with the first light-emitting device, and the electrode transition line is electrically connected with the first pixel circuit. Reference is made to FIG. 11, which is a schematic structural diagram of a display panel according to an embodiment of the present disclosure. The display panel according to the embodiment of the present disclosure includes a bearing substrate 710, a buffer layer 780, a transistor array layer 720, a first insulation layer 722, a gate metal layer 723, a second insulation layer 724, a capacitor metal layer 725, a third insulation layer 726, a source-drain metal layer 727, a passivation layer 730, a transparent structure layer, a planarization layer 750 and a pixel definition layer 760.

The buffer layer 780 is arranged on a surface of the bearing substrate 710.

The transistor array layer 720 is arranged on a surface of the buffer layer 780 which faces away from the bearing substrate 710, where the transistor array layer 720 includes a semiconductor layer 721 arranged on a surface of the bearing substrate 710. The first insulation layer 722 is arranged on a side of the semiconductor layer 721 which faces away from the bearing substrate 710. The gate metal layer 723 is arranged on a side of the first insulation layer 722 which faces away from the bearing substrate 710. The second insulation layer 724 is arranged on a side of the gate metal layer 723 which faces away from the bearing substrate 710. The capacitor metal layer 725 is arranged on a side of the second insulation layer 724 which faces away from the bearing substrate 710. The third insulation layer 726 is arranged on a side of the capacitor metal layer 725 which faces away from the bearing substrate 710. The source-drain metal layer 727 is arranged on a side of the third insulation layer 726 which faces away from the bearing substrate 710. An active region in the semiconductor layer 721 of the transistor array layer 720, a gate in the gate metal layer 723 and a source and a drain in the source-drain metal layer 727 form a transistor. The transistor array layer 720 includes a first pixel circuit and a second pixel circuit, where the first pixel circuit is arranged outside the optical component area 101 and includes multiple transistors 7202.

The passivation layer 730 is arranged on a side of the transistor array layer 720 which faces away from the bearing substrate 710.

The transparent structure layer is arranged on a side of the passivation layer 730 which faces away from the bearing substrate 710. The transparent structure layer includes at least one transparent conductive layer 300, and in a case that the transparent structure layer includes multiple laminated transparent conductive layers, adjacent transparent conductive layers are isolated and insulated from each other by an isolation layer.

The planarization layer 750 is arranged on a side of the transparent structure layer which faces away from the bearing substrate 710.

The pixel definition layer 760 is arranged on a side of the planarization layer 750 which faces away from the bearing substrate 710. The pixel definition layer 760 includes multiple openings, and the light-emitting device is arranged at the opening of the pixel definition layer 760. The light-emitting device according to the embodiment of the present disclosure may include an anode 771, a light-emitting layer 772 and a cathode 773 that are laminated in order. In one embodiment, under the same test conditions, a light transmittance of the transparent conductive layer 300 is higher than a light transmittance of the anode 771.

As shown in FIG. 11, a connection wire is formed in the transparent conductive layer 300 according to an embodiment of the present disclosure, and the connection wire includes an electrode transition line 3002. The electrode transition line 3002 is electrically connected with the anode 771 of the first light-emitting device in the optical component area 101 via a via-hole. An external connection line connected with a transistor 7202 of the first pixel circuit is formed in at least one of the gate metal layer 723, the capacitor metal layer 725 and the source-drain metal layer 727, for example, the external connection line 7252 is formed in the capacitor metal layer 725. In this way, the electrode transition line 3002 can be electrically connected with the external connection line 7252 via a via-hole outside the optical component area 101, to electrically connect the first pixel circuit with the first light-emitting device.

Figure 12:
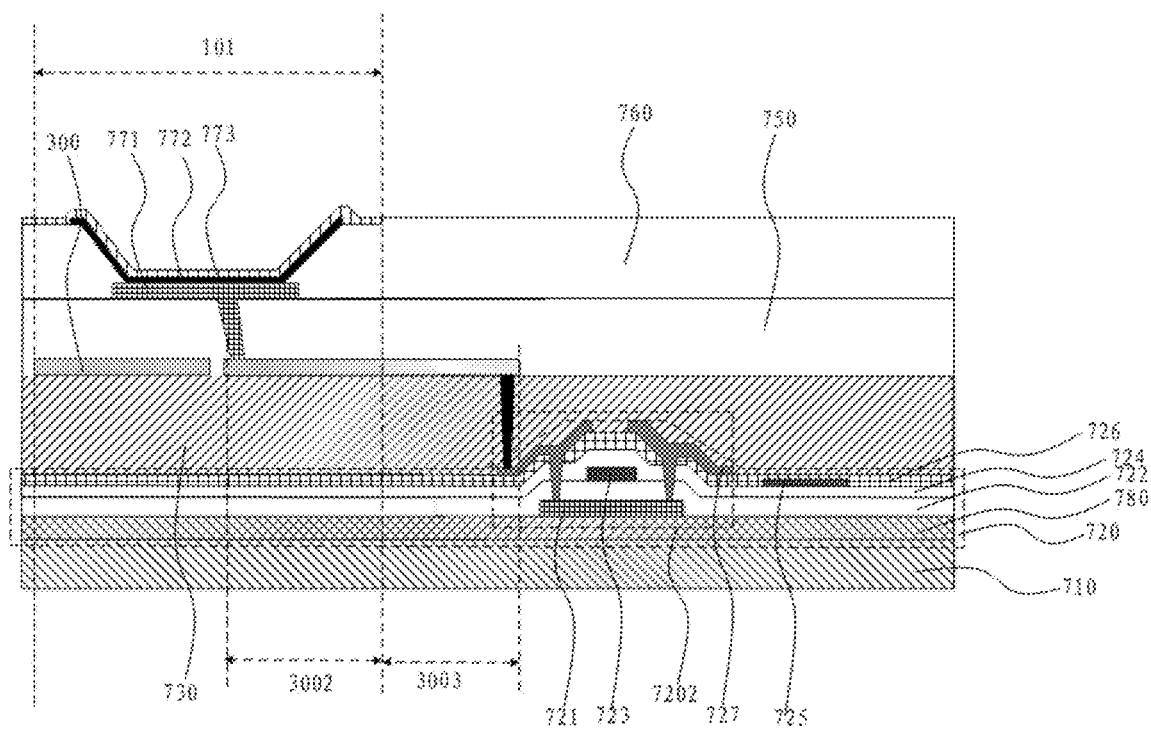
FIG. 12 is another schematic structural diagram of a display panel according to an embodiment of the present disclosure.

In one embodiment, in a case that the first pixel circuit is arranged outside the optical component area, the transparent conductive layer may be fully utilized according to an embodiment of the present disclosure. That is, an auxiliary signal line in direct electrical connection with the electrode transition line is formed in the transparent conductive layer outside the optical component area, and the auxiliary signal line is electrically connected with the first pixel circuit to electrically connect the first pixel circuit with the first light-emitting device. Reference is made to FIG. 12, which is a schematic structural diagram of a display panel according to an embodiment of the present disclosure. The display panel shown in FIG. 12 differs from the display panel shown in FIG. 11 is that the display panel shown in FIG. 12 does not include the external connection line. The transparent conductive layer 300 may further include multiple auxiliary signal lines 3003 outside the optical component area 101. The first pixel circuit is electrically connected with the electrode transition line 3002 via the auxiliary signal line 3003. In one embodiment, the auxiliary signal line 3003 and the electrode transition line 3002 that are electrically connected are arranged in a same layer. The auxiliary signal line 3003 may be formed by extending the electrode transition line 3002 to outside the optical component area 101, to electrically connect with the first pixel circuit.

It should be noted that in the embodiments of the present disclosure shown in FIGS. 10 to 12 above, description is made with reference to a case that the transistor is a top-gate transistor for example. The transistor may alternatively be a bottom-gate transistor, that is, an active region of the transistor is arranged above the gate, while a source and a drain thereof are arranged on a side of the active region which faces away from the gate, which is not detailed in the present disclosure.

Figure 13:
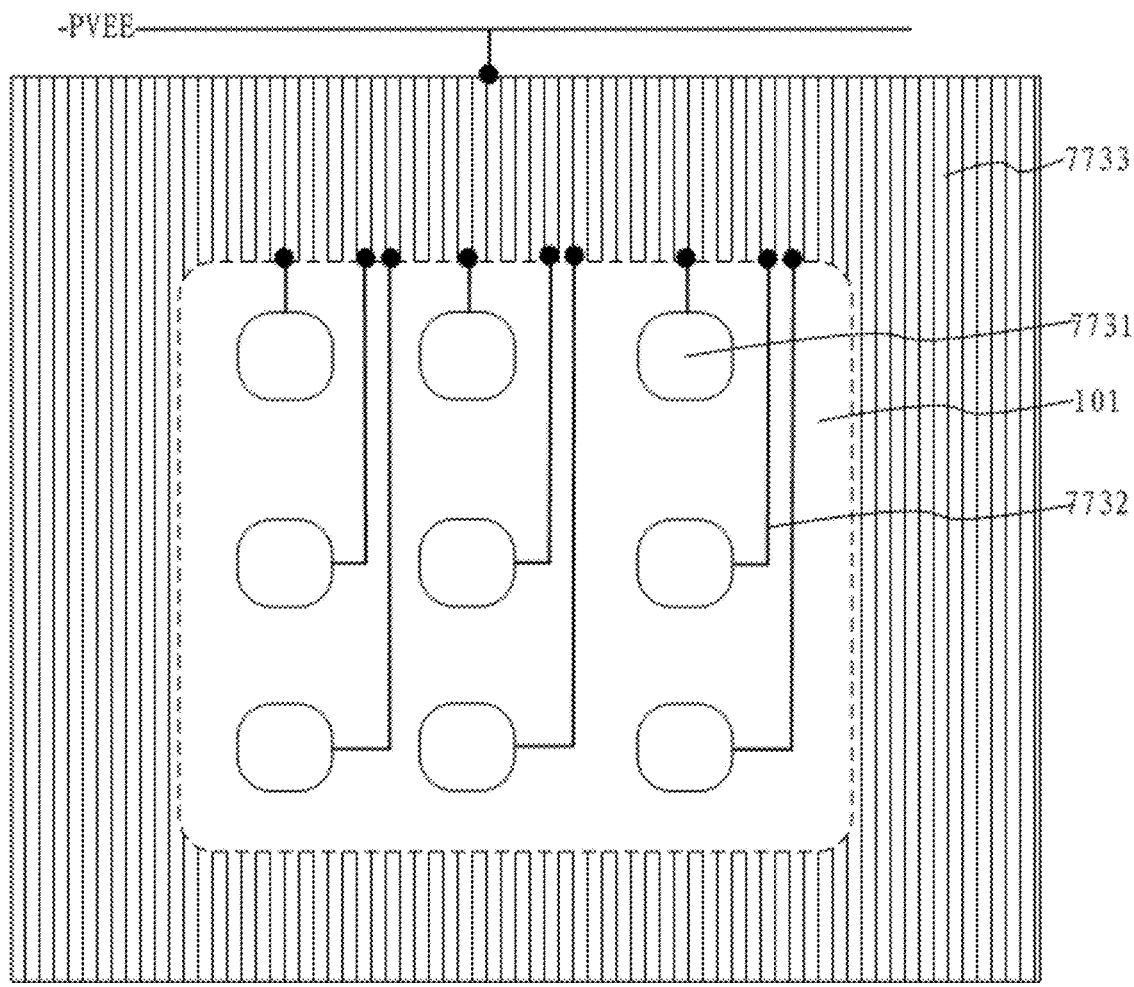
FIG. 13 is a schematic structural diagram of connection with a cathode in an optical component area according to an embodiment of the present disclosure.
Figure 14:
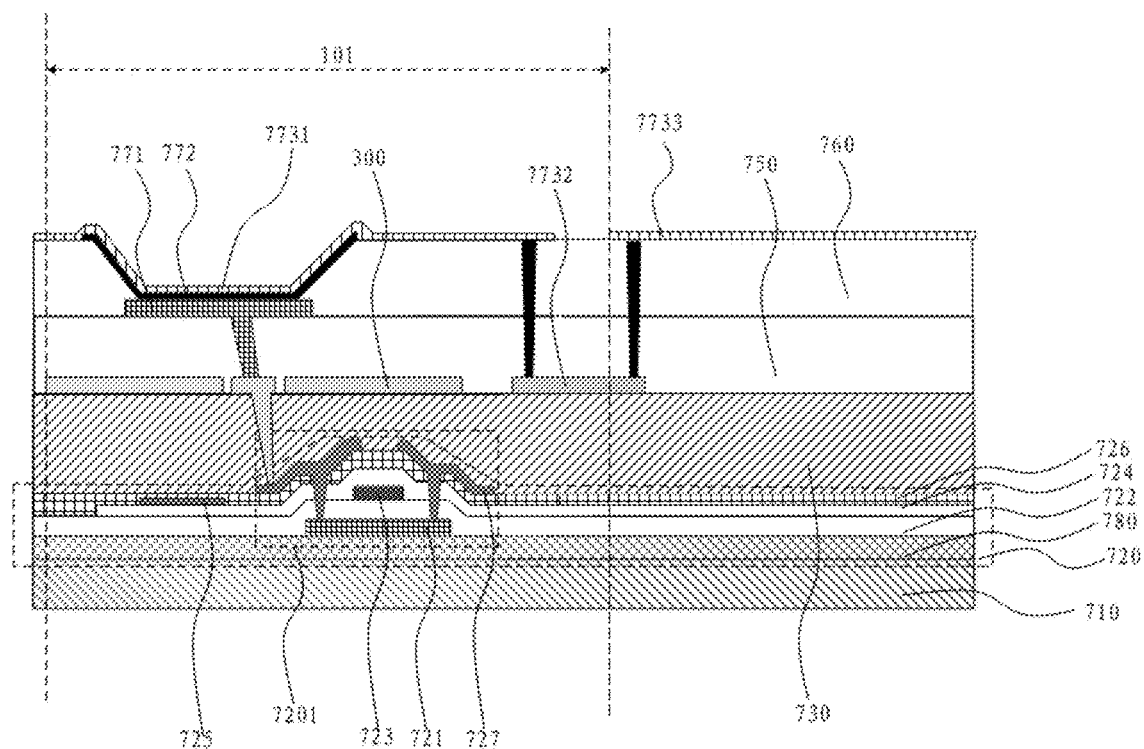
FIG. 14 is another schematic structural diagram of a display panel according to an embodiment of the present disclosure.

In an embodiment of the present disclosure, the light-emitting device of the display panel includes an anode, a light-emitting layer and a cathode that are laminated in order. The display panel may include a whole plane of cathode layer, and cathodes of all light-emitting devices are corresponding portions of the cathode layer. Alternatively, each of the cathodes of different light-emitting devices may be an independent electrode structure, and each of the independent cathodes is electrically connected with the cathode signal line, which is not limited in the present disclosure. In a case that the cathodes of different first light-emitting device are independent from each other, the independent cathodes may be connected with the cathode signal line via respective cathode transition lines, or some or all of the cathodes are connected with each other and are further electrically connected with the cathode signal line. Reference is made to FIG. 13, which is a schematic structural diagram of connection with a cathode in an optical component area according to an embodiment of the present disclosure. The first light-emitting device include an anode (not shown), a light-emitting layer (not shown) and a cathode 7731 that are laminated in order. A gap is provided between cathodes 7731 of different first light-emitting devices. A cathode 7731 of at least one first light-emitting device is electrically connected with the cathode signal line PVEE via a respective cathode transition line 7732. All the light-emitting devices outside the optical component area 101 according to an embodiment of the present disclosure share a common cathode layer 7733. The cathode layer 7733 is electrically connected with the cathode signal line PVEE. The cathode 7731 of the first light-emitting device according to the embodiment of the present disclosure may be electrically connected with the cathode layer 7733 outside the optical component area 101 via the cathode transition line 7732, to connect the cathode 7731 of the first light-emitting device with the cathode signal line PVEE. As shown in FIG. 14, the cathode transition line 7732 according to an embodiment of the present disclosure may be arranged in the transparent conductive layer 300 (that is, the connection wire includes the cathode transition line). The cathode transition line 7732 is electrically connected with the cathode 7731 of the first light-emitting device via a via-hole, and the cathode transition line 7732 is electrically connected with the cathode layer 7733 via a via-hole to connect the cathode 7731 of the first light-emitting device with the cathode signal line. It should be noted that FIG. 14 is taking build-in TFT only for example and the solution of cathode transition line is also applicable to external TFT configurations.

Figure 15:
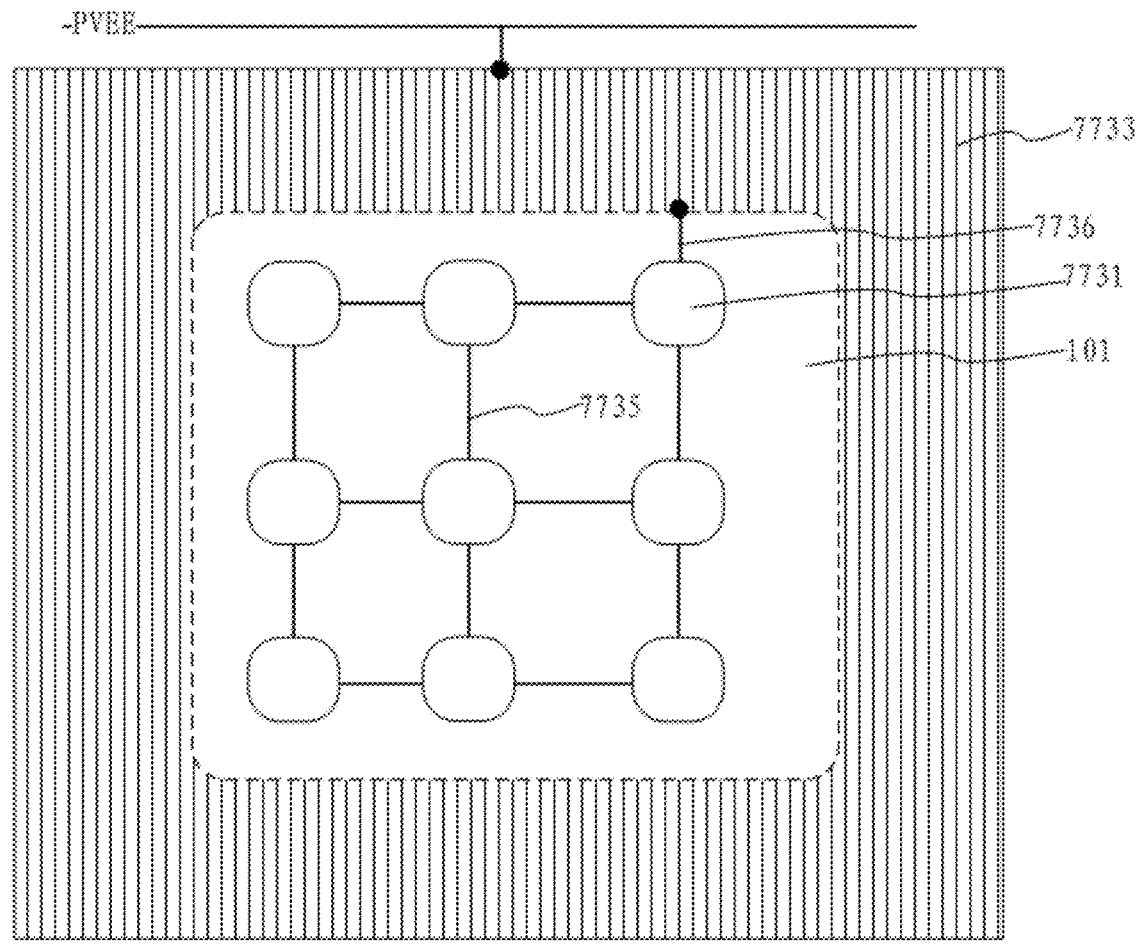
FIG. 15 is another schematic structural diagram of connection with a cathode in an optical component area according to an embodiment of the present disclosure.
Figure 16:
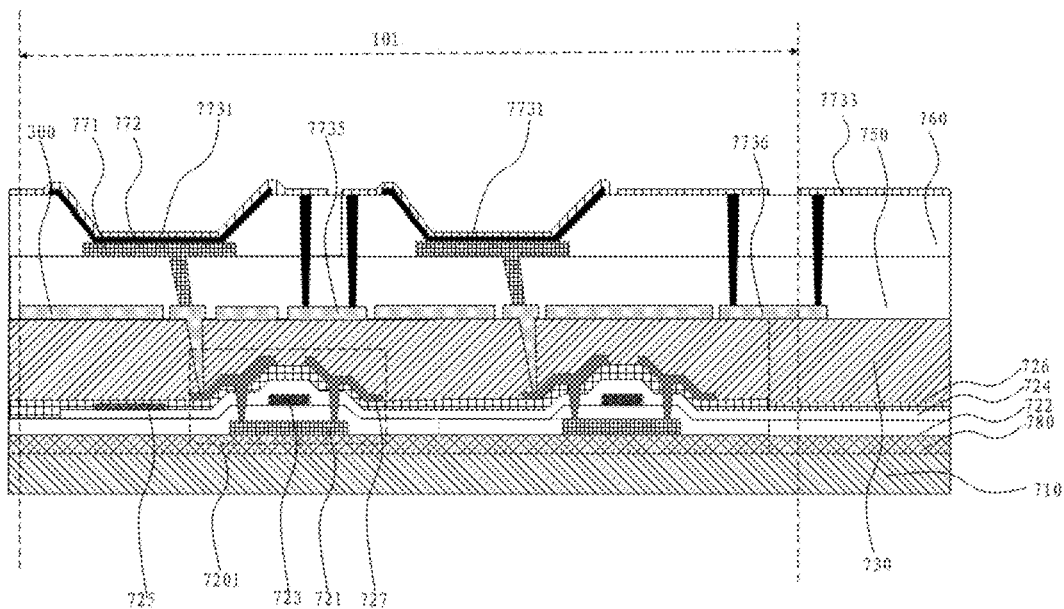
FIG. 16 is another schematic structural diagram of a display panel according to an embodiment of the present disclosure.

In one embodiment, reference is made to FIG. 15, which is a schematic structural diagram of connection with a cathode in an optical component area according to an embodiment of the present disclosure. The first light-emitting device include an anode (not shown), a light-emitting layer (not shown) and a cathode 7731 that are laminated in order. A gap is provided between cathodes 7731 of different first light-emitting devices. Cathodes 7731 of at least multiple of the first light-emitting devices are electrically connected with each other via an interconnection line 7735 in the optical component area 101, and then the connected multiple cathodes 7731 are electrically connected with the cathode signal line PVEE via a lead line 7736. All the light-emitting devices outside the optical component area 101 according to the embodiment of the present disclosure share a common cathode layer 7733. The cathode layer 7733 is electrically connected with the cathode signal line PVEE. The cathode 7731 of the first light-emitting device according to the embodiment of the present disclosure may be electrically connected with the cathode layer 7733 outside the optical component area 101 via the lead line 7736, to connect the cathode 7731 of the first light-emitting device with the cathode signal line PVEE. As shown in FIG. 16, the interconnection line 7735 and the lead line 7736 according to an embodiment of the present disclosure may both be arranged in the transparent conductive layer 300 (that is, the connection wire includes the interconnection line and the lead line). Cathodes 7731 of different first light-emitting devices are electrically connected with each other by the interconnection line 7735 via a via-hole. The lead line 7736 is electrically connected with the cathodes 7731 of the first light-emitting devices via a via-hole and electrically connected with the cathode layer 7733 via a via-hole, to connect the cathode of the first light-emitting device with the cathode signal line. It should be noted that Figure is taking build-in TFT only for example and the solution of cathode transition line is also applicable to external TFT configurations.

Figure 17:
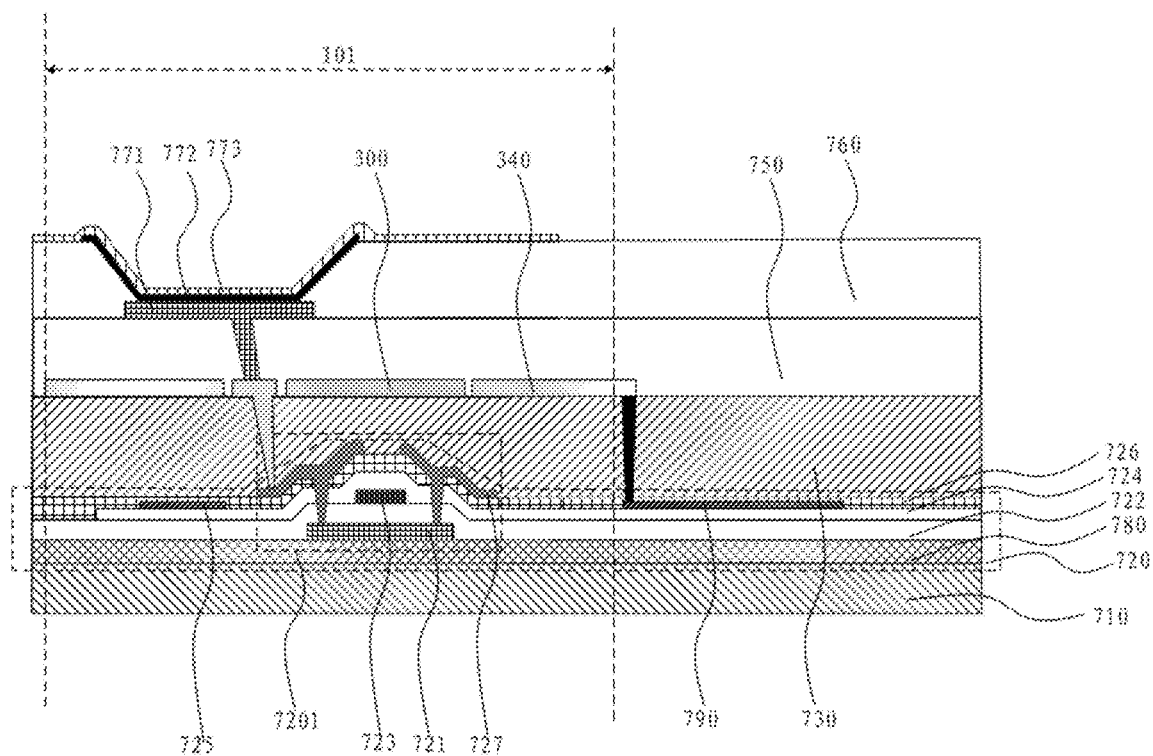
FIG. 17 is another schematic structural diagram of a display panel according to an embodiment of the present disclosure.

Reference is made to FIG. 17, which is a schematic structural diagram of a display panel according to an embodiment of the present disclosure. The display panel according to the embodiment of the present disclosure includes a fixed voltage signal line 790, and the auxiliary layer 340 is electrically connected with the fixed voltage signal line 790. The fixed voltage signal line 790 according to an embodiment of the present disclosure is arranged outside the optical component area 101. The auxiliary layer 340 may be electrically connected with the fixed voltage signal line 790 via a via-hole outside the optical component area 101.

Figure 18:
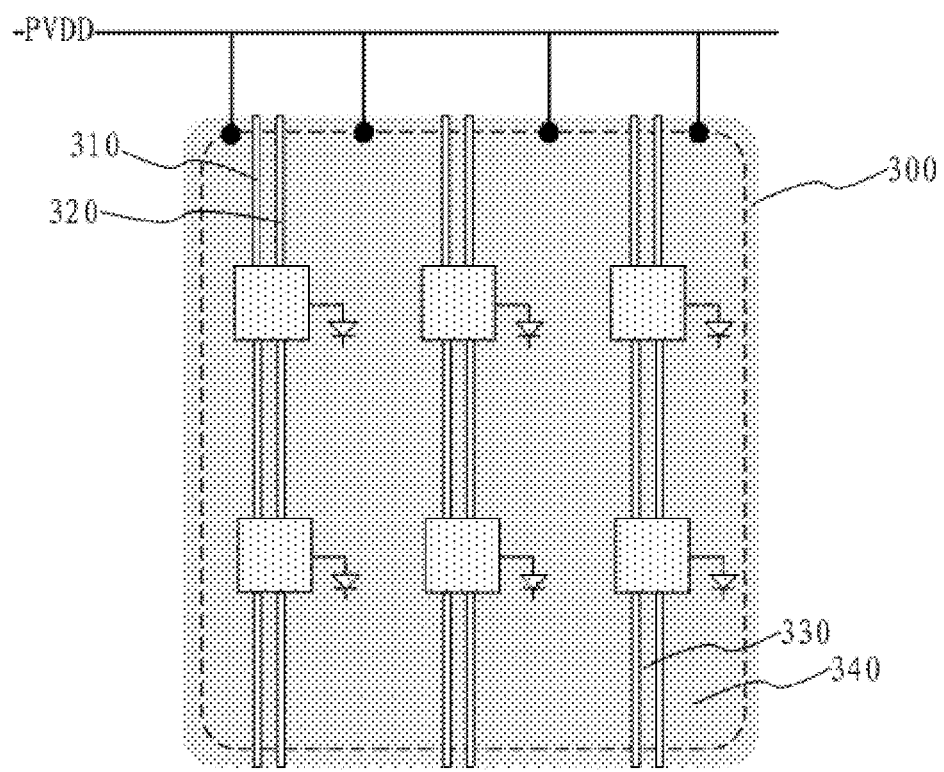
FIG. 18 is a schematic diagram of connection between an auxiliary layer and a power supply voltage signal line according to an embodiment of the present disclosure.
Figure 19:
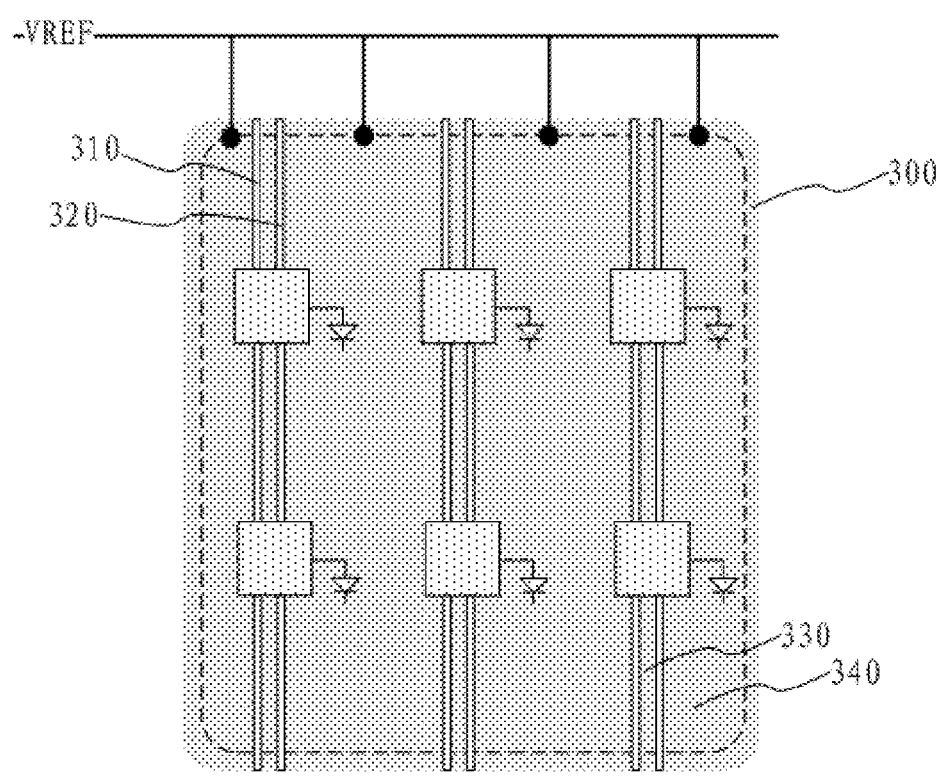
FIG. 19 is a schematic diagram of connection between an auxiliary layer and a reference voltage signal line according to an embodiment of the present disclosure.

It should be understood that the auxiliary layer according to the embodiment of the present disclosure is electrically connected with the fixed voltage signal line, which can reduce an impedance of the fixed voltage signal line to mitigate the problem of large voltage drop on the fixed voltage signal line. In one embodiment, the fixed voltage signal line according to an embodiment of the present disclosure includes one of a reference voltage signal line and a power supply voltage signal line. As shown in FIG. 18, the fixed voltage signal line according to an embodiment of the present disclosure may be the power supply voltage signal line PVDD, and the auxiliary layer 340 may be electrically connected with the power supply voltage signal line PVDD via a via-hole outside the optical component area. As shown in FIG. 19, the fixed voltage signal line according to an embodiment of the present disclosure may be the reference voltage signal line VREF, and the auxiliary layer 340 may be electrically connected with the reference voltage signal line VREF via a via-hole outside the optical component area. In a case that the first pixel circuit according to an embodiment of the present disclosure is arranged in the optical component area, the connection wire in the transparent conductive layer includes a reference voltage transition line and a power supply voltage transition line, where the auxiliary layer may be connected with the reference voltage transition line or the power supply voltage transition line to connect the auxiliary layer with the fixed voltage signal line.

Figure 20:
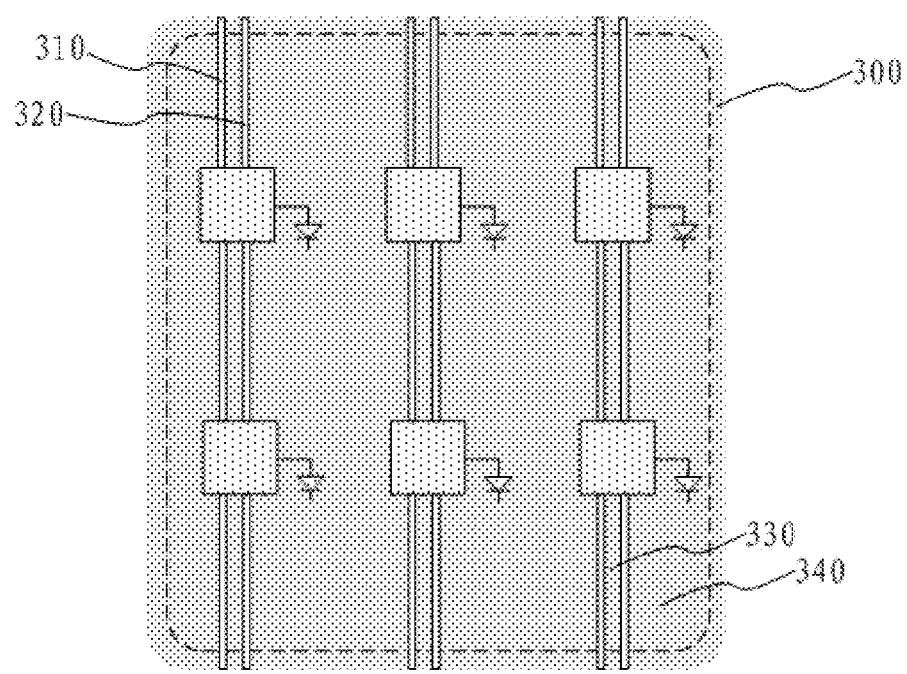
FIG. 20 is a schematic structural diagram of a floating auxiliary layer according to an embodiment of the present disclosure.

In one embodiment, in an embodiment of the present disclosure, the auxiliary layer is arranged floating, that is, the auxiliary layer is not connected with any lines. As shown in FIG. 20, compared with the FIGS. 18 and 19, the auxiliary layer 340 in FIG. 20 is floating, which is not required to connect to any signal lines. In this way, interference to other lines overlapping with the auxiliary layer can be avoided when the auxiliary layer is connected with signals, which ensures that signal wires in the display panel is less affected by the interference.

Figure 21:
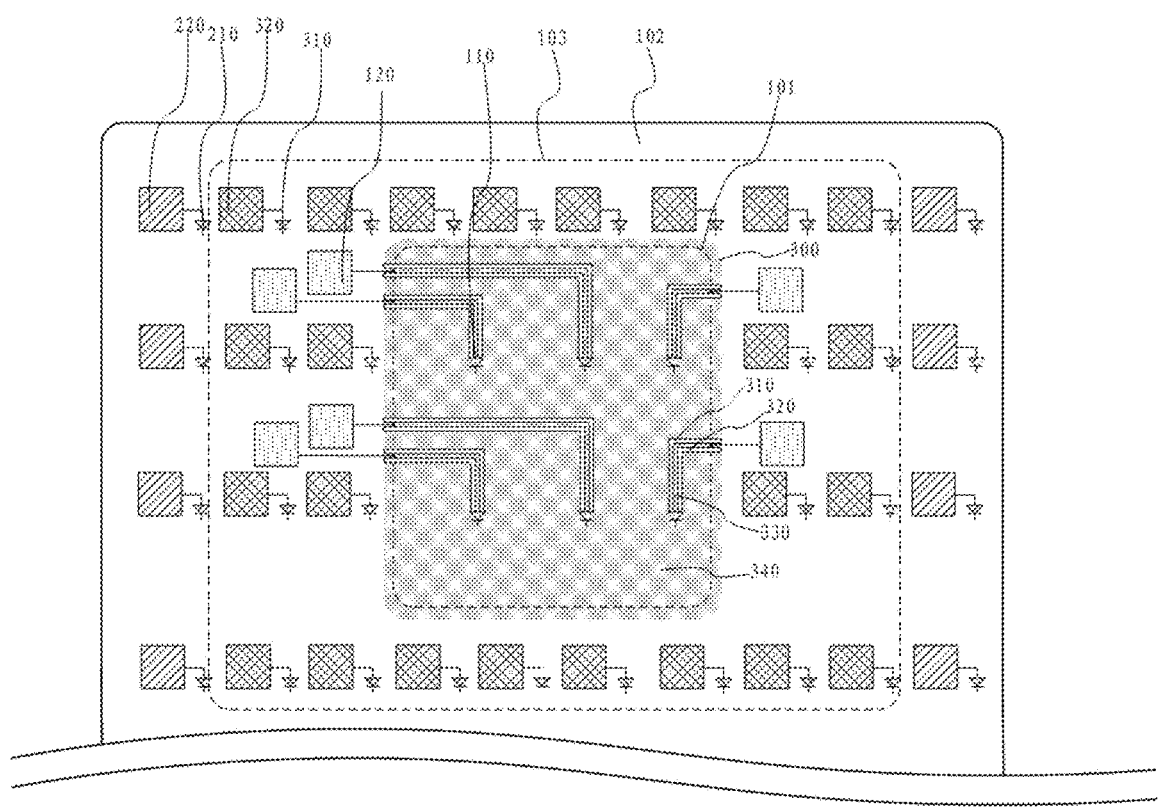
FIG. 21 is another schematic structural diagram of a display panel according to an embodiment of the present disclosure.

Reference is made to FIG. 21, which is a schematic structural diagram of a display panel according to an embodiment of the present disclosure. The multiple pixels according to the embodiment of the present disclosure further includes a third pixel. The third pixel includes a third light-emitting device 310 and a third pixel circuit 320 connected with each other. The display area further includes a transitional display area 103 arranged between the regular display area 102 and the optical component area 101. The third light-emitting device 310 is arranged in the transitional display area 103. A density of light-emitting devices in the transitional display area 103 is greater than or equal to a density of light-emitting devices in the optical component area 101, and the density of light-emitting devices in the transitional display area 103 is less than the density of light-emitting devices in the regular display area 102.

It should be understood that the display area according to an embodiment of the present disclosure is provided with the transitional display area to optimize the display effect between the regular display area and the optical component area, to improve visual experience of a user. In one embodiment, in a case that the first pixel circuit is arranged outside the optical component area, the first pixel circuit is arranged in the transitional display area.

In any one of the above embodiments of the present disclosure, the transparent conductive layer includes at least one of an indium tin oxide (ITO) layer, an indium zinc oxide (IZO) layer and a nanometer silver wire layer. That is, the transparent conductive layer according to an embodiment of the present disclosure may be an ITO layer, an IZO layer, or a nanometer silver wire layer; or the transparent conductive layer may include multiple laminated layers, and each of the laminated layers may be an ITO layer, an IZO layer or a nanometer silver wire layer, which is not limited in the present disclosure.

In any one of the above embodiments of the present disclosure, in a case that the first pixel circuit according to the present disclosure is arranged in the optical component area, all pixel units of which the first light-emitting devices are connected with the first pixel circuit may be arranged in a regular manner, for example, in an array, or in a irregular manner, which is not limited in the present disclosure and can be designed according to practical applications.

Accordingly, based on the embodiments of the disclosure, a display device is further provided according to the present disclosure. The display device includes the flexible display panel according to any one of above embodiments.

Figure 22:
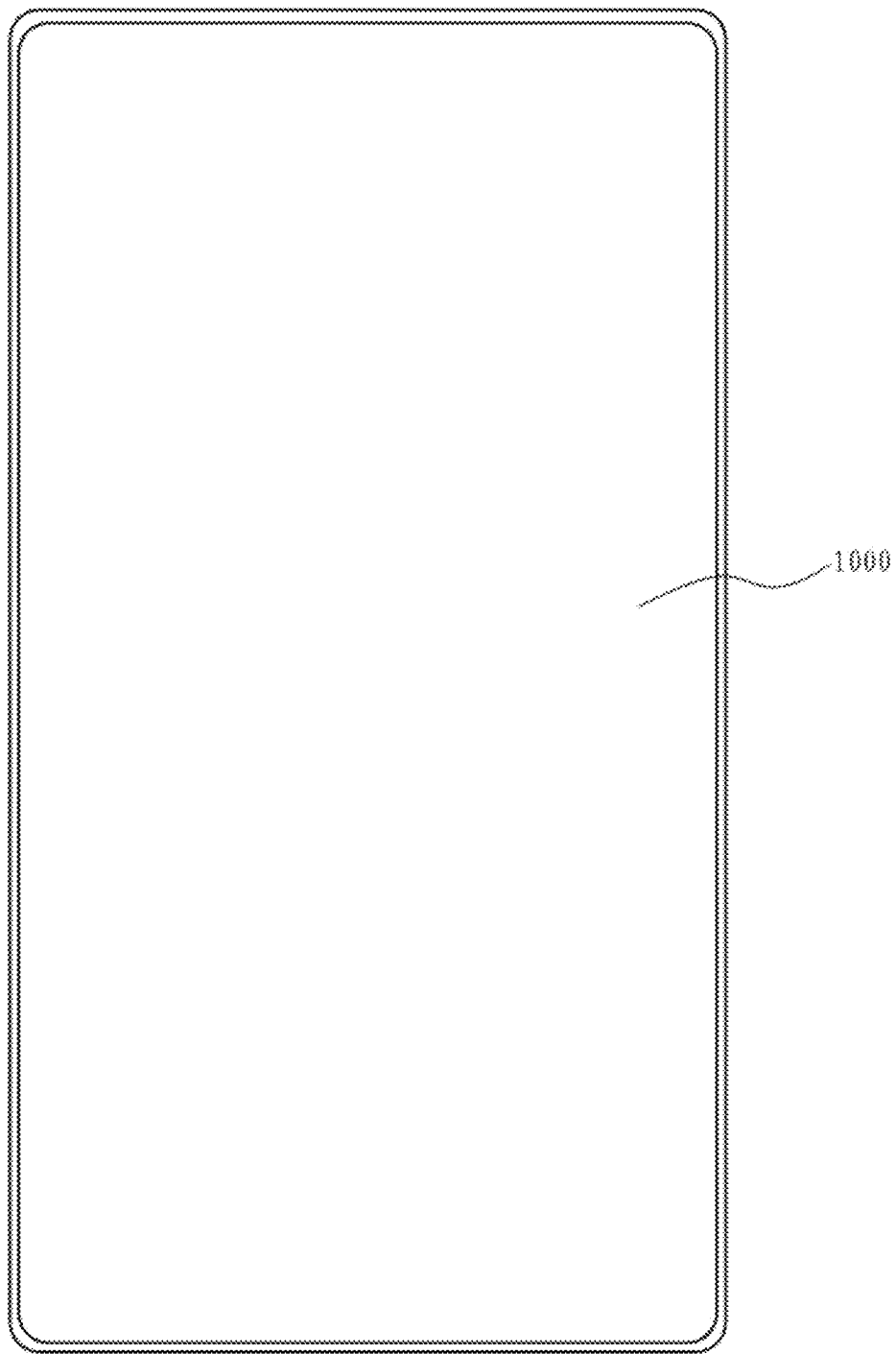
FIG. 22 is another schematic structural diagram of a display device according to an embodiment of the present disclosure.

Reference is made to FIG. 22, which is a schematic structural diagram of a display device according to an embodiment of the present disclosure. The display device 1000 according to an embodiment of the present disclosure may be a mobile terminal.

In one embodiment, the display device according to the present disclosure may be other electronic display devices such as a computer and a wearable display device, which is not limited in the present disclosure.

In the display panel and the display device according to the present disclosure, the display area of the display panel includes the optical component area and the regular display area, and both the optical component area and the regular display area include light-emitting devices, so that the area of the display area becomes larger to meet the trend of full screen display. In the optical component area, the transparent conductive layer includes the first etching slot and the second etching slot that are paired with each other, the connection wire arranged between the first etching slot and the second etching slot that are paired with each other, and the auxiliary layer arranged outside the first etching slot and the second etching slot that are paired with each other. Not only signals can be transmitted by the connection wire, but also the integrity of the transparent conductive layer in the optical component area can be ensured by etching the transparent conductive layer to form slots and reserving the auxiliary layer, so that the uniformity of light transmission of the transparent conductive layer in the optical component area becomes higher, which improves uniformity of light transmission of the light-transmissive area in the optical component area and improving image acquisition effects of corresponding optical components in the optical component area.

What is claimed is:

1. A display panel comprising:
   a plurality of pixels comprising a first pixel and a second pixel, wherein the first pixel comprises a first light-emitting device and a first pixel circuit connected with each other, and the second pixel comprises a second light-emitting device and a second pixel circuit connected with each other;
   a display area comprising an optical component area and a regular display area, wherein the first light-emitting device is arranged in the optical component area, and the second light-emitting device is arranged in the regular display area; and
   at least one transparent conductive layer arranged in the optical component area, wherein the transparent conductive layer comprises a first etching slot and a second etching slot that are paired with each other, a connection wire arranged between the first etching slot and the second etching slot that are paired with each other, and an auxiliary layer arranged outside the first etching slot and the second etching slot that are paired with each other;
   wherein the display panel comprises a plurality of transparent conductive layers, and in a direction perpendicular to a plane on which the display panel is located, the first etching slot and/or the second etching slot of at least one of the transparent conductive layers is overlapped with the auxiliary layer of at least one of the other transparent conductive layers.

2. The display panel according to claim 1, wherein the transparent conductive layer comprises a plurality of first etching slots and second etching slots that are paired with each other, connection wires arranged between the first etching slots and the second etching slots that are paired with each other, and an auxiliary layer arranged outside the first etching slots and the second etching slots that are paired with each other.

3. The display panel according to claim 1, wherein at least one side edge of at least one of the first etching slot and the second etching slot is a wavy line.

4. The display panel according to claim 3, wherein the wavy line is cosine-shaped or sine-shaped.

5. The display panel according to claim 1, wherein a density of light-emitting devices in the optical component area is less than a density of light-emitting devices in the regular display area.

6. The display panel according to claim 5, wherein at least one first light-emitting device comprises a plurality of light-emitting sub-devices, and anodes of the plurality of light-emitting sub-devices are connected with each other.

7. The display panel according to claim 1, wherein the first pixel circuit is arranged in the optical component area, the connection wire comprises at least one of a scan signal transition line, a data transition line, a reset signal transition line, a reference voltage transition line and a power supply voltage transition line that are connected with the first pixel circuit.

8. The display panel according to claim 1, wherein the first pixel circuit is arranged outside the optical component area, the connection wire comprises an electrode transition line electrically connected with the first light-emitting device, and the electrode transition line is electrically connected with the first pixel circuit.

9. The display panel according to claim 8, wherein the transparent conductive layer further comprises a plurality of auxiliary signal lines outside the optical component area, and the first pixel circuit is electrically connected with the electrode transition line via the auxiliary signal line.

10. The display panel according to claim 9, wherein the auxiliary signal line and the electrode transition line electrically connected with each other are arranged in a same layer.

11. The display panel according to claim 1, wherein:
the first light-emitting device comprises an anode, a light-emitting layer and a cathode that are laminated in order, wherein a gap is provided between cathodes of different first light-emitting devices;
a cathode of at least one of the first light-emitting devices is electrically connected with a cathode signal line via a respective cathode transition line; or
cathodes of at least a plurality of the first light-emitting devices are electrically connected with the cathode signal line via a lead line in the optical component area.

12. The display panel according to claim 1, wherein the display panel comprises a fixed voltage signal line, and the auxiliary layer is electrically connected with the fixed voltage signal line.

13. The display panel according to claim 12, wherein the fixed voltage signal line comprises one of a reference voltage signal line and a power supply voltage signal line.

14. The display panel according to claim 1, wherein the auxiliary layer is floating.

15. The display panel according to claim 1, wherein:
the plurality of pixels further comprises a third pixel, and the third pixel comprises a third light-emitting device and a third pixel circuit connected with each other;
the display area further comprises a transitional display area arranged between the regular display area and the optical component area, and the third light-emitting device is arranged in the transitional display area; and
a density of light-emitting devices in the transitional display area is greater than or equal to the density of light-emitting devices in the optical component area, and the density of light-emitting devices in the transitional display area is less than the density of light-emitting devices in the regular display area.

16. The display panel according to claim 15, wherein in a case that the first pixel circuit is arranged outside the optical component area, the first pixel circuit is arranged in the transitional display area.

17. The display panel according to claim 1, wherein the transparent conductive layer comprises at least one of an indium tin oxide (ITO) layer, an indium zinc oxide (IZO) layer and a nanometer silver wire layer.

18. A display device comprising a display panel, wherein the display panel comprises:
a plurality of pixels comprising a first pixel and a second pixel, wherein the first pixel comprises a first light-emitting device and a first pixel circuit connected with each other, and the second pixel comprises a second light-emitting device and a second pixel circuit connected with each other;
a display area comprising an optical component area and a regular display area, wherein the first light-emitting device is arranged in the optical component area, and the second light-emitting device is arranged in the regular display area; and
at least one transparent conductive layer arranged in the optical component area, wherein the transparent conductive layer comprises a first etching slot and a second etching slot that are paired with each other, a connection wire arranged between the first etching slot and the second etching slot that are paired with each other, and an auxiliary layer arranged outside the first etching slot and the second etching slot that are paired with each other;
wherein at least one side edge of at least one of the first etching slot and the second etching slot is a wavy line.

19. A display panel comprising:
a plurality of pixels comprising a first pixel and a second pixel, wherein the first pixel comprises a first light-emitting device and a first pixel circuit connected with each other, and the second pixel comprises a second light-emitting device and a second pixel circuit connected with each other;
a display area comprising an optical component area and a regular display area, wherein the first light-emitting device is arranged in the optical component area, and the second light-emitting device is arranged in the regular display area; and
at least one transparent conductive layer arranged in the optical component area, wherein the transparent conductive layer comprises a first etching slot and a second etching slot that are paired with each other, a connection wire arranged between the first etching slot and the second etching slot that are paired with each other, and an auxiliary layer arranged outside the first etching slot and the second etching slot that are paired with each other;
wherein at least one side edge of at least one of the first etching slot and the second etching slot is a wavy line.

20. A display panel comprising:
a plurality of pixels comprising a first pixel and a second pixel, wherein the first pixel comprises a first light-emitting device and a first pixel circuit connected with each other, and the second pixel comprises a second light-emitting device and a second pixel circuit connected with each other;
a display area comprising an optical component area and a regular display area, wherein the first light-emitting device is arranged in the optical component area, and the second light-emitting device is arranged in the regular display area; and
at least one transparent conductive layer arranged in the optical component area, wherein the transparent conductive layer comprises a first etching slot and a second etching slot that are paired with each other, a connection wire arranged between the first etching slot and the second etching slot that are paired with each other, and an auxiliary layer arranged outside the first etching slot and the second etching slot that are paired with each other;
wherein the first pixel circuit is arranged outside the optical component area, the connection wire comprises an electrode transition line electrically connected with the first light-emitting device, and the electrode transition line is electrically connected with the first pixel circuit.

* * * * *